United States Patent [19]
Samueli et al.

[11] Patent Number: 5,604,741
[45] Date of Patent: Feb. 18, 1997

[54] ETHERNET SYSTEM

[75] Inventors: Henry Samueli, Northridge; Mark Berman, Los Angeles; Fang Lu, Torrance, all of Calif.

[73] Assignee: Broadcom Corporation, Irvine, Calif.

[21] Appl. No.: 398,759

[22] Filed: Mar. 16, 1995

[51] Int. Cl.$^6$ ..................................................... H03H 7/30
[52] U.S. Cl. ........................... 370/402; 370/447; 375/231; 375/345; 375/356
[58] Field of Search ........................... 370/94.3, 93, 85.3, 370/56; 375/230, 231, 232, 233, 345, 355, 356, 373, 376

[56] References Cited

U.S. PATENT DOCUMENTS

| | | | |
|---|---|---|---|
| 3,962,637 | 6/1976 | Motley et al. | 375/355 |
| 4,597,089 | 6/1986 | Motley et al. | 375/231 |
| 4,599,732 | 7/1986 | LeFever | 375/355 |
| 4,864,590 | 9/1989 | Arnon et al. | 375/233 |
| 5,003,555 | 3/1991 | Bergmans | 375/233 |
| 5,065,412 | 11/1991 | Schenk | 375/373 |
| 5,230,012 | 7/1993 | Schenk | 375/373 |
| 5,276,711 | 1/1994 | Rossi | 375/355 |
| 5,444,712 | 8/1995 | Betts et al. | 370/110.1 |

*Primary Examiner*—Douglas W. Olms
*Assistant Examiner*—Chau T. Nguyen
*Attorney, Agent, or Firm*—Ellsworth R. Roston; Charles H. Schwartz

[57] ABSTRACT

Four (4) unshielded twisted pairs of wires connect a hub and a computer in an Ethernet system: one (1) pair for transmission only, another for reception only and the other two (2) for transmission and reception. The signals in the wires are in packets each having timing signals defining a preamble and thereafter having digital signals representing information as by individual ones of three (3) amplitude levels. The signals received at the computer are provided with an automatic gain control (AGC) and then with digital conversions at a particular rate. A control loop operative upon the digital conversions regulates the AGC gain at a particular value. An equalizer operative only during the occurrence of the digital signals in each packet selects an individual one of the three (3) amplitude levels closest to the amplitude of each digital conversion at the time assumed to constitute the conversion peak. The amplitudes of the timing signals in each preamble at the times assumed to constitute the peaks and zero crossings of such signals are multiplied. The rate of such digital conversions is adjusted in accordance with the polarity and magnitude of the multiplication product. The relative amplitudes of the successive equalizer values following each preamble are evaluated at the times assumed to be the peaks of the digital conversions. The rate of the digital conversions is adjusted in accordance with such evaluations, thereby further regulating the digital conversions at the particular rate. The equalizer thus operates on the information signals in each packet at the signal peaks.

103 Claims, 13 Drawing Sheets

FIG. 5
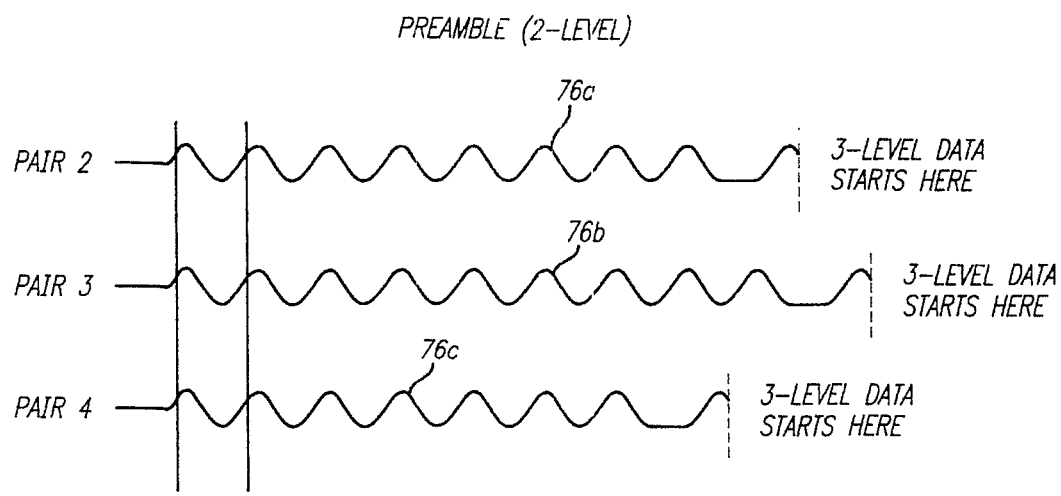
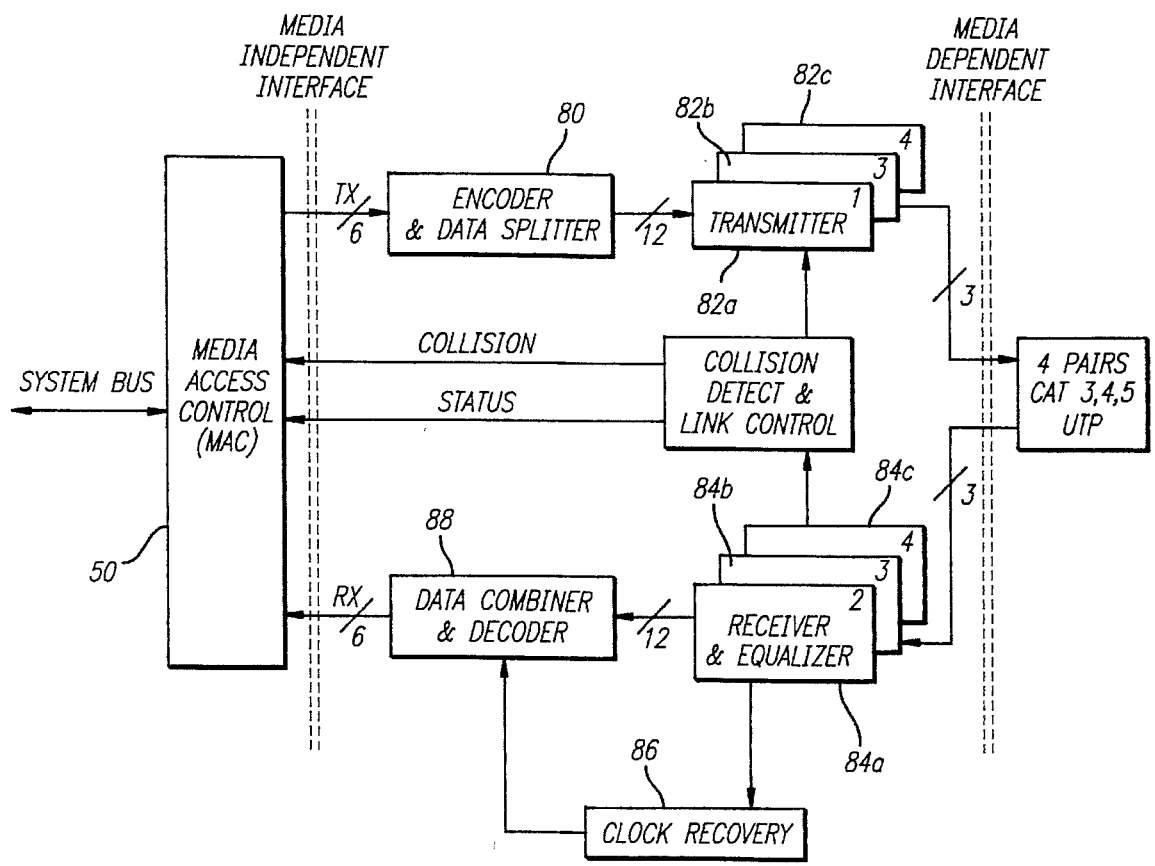
FIG. 6

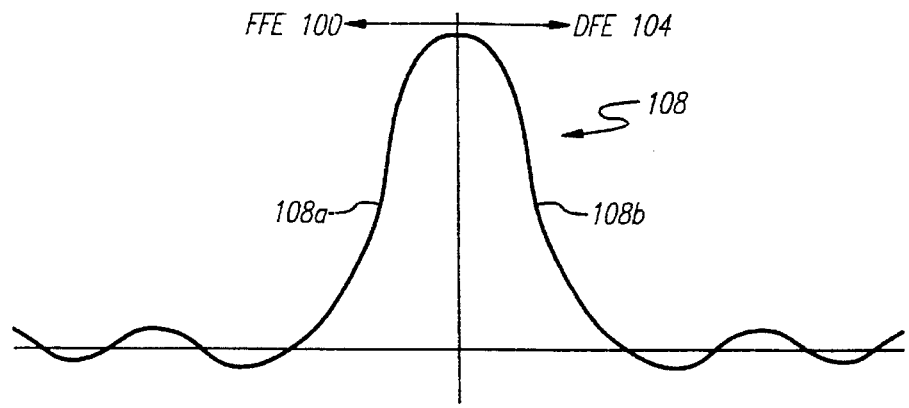
FIG. 8
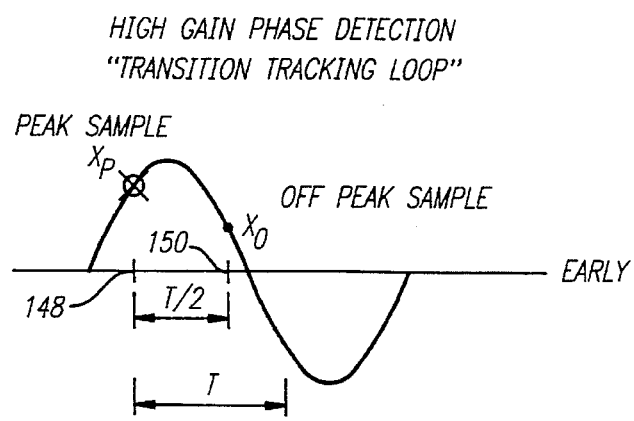
FIG. 12a
FIG. 12b
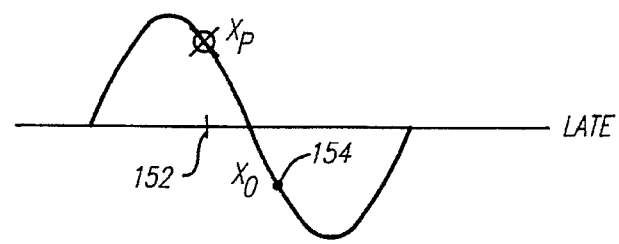
FIG. 15

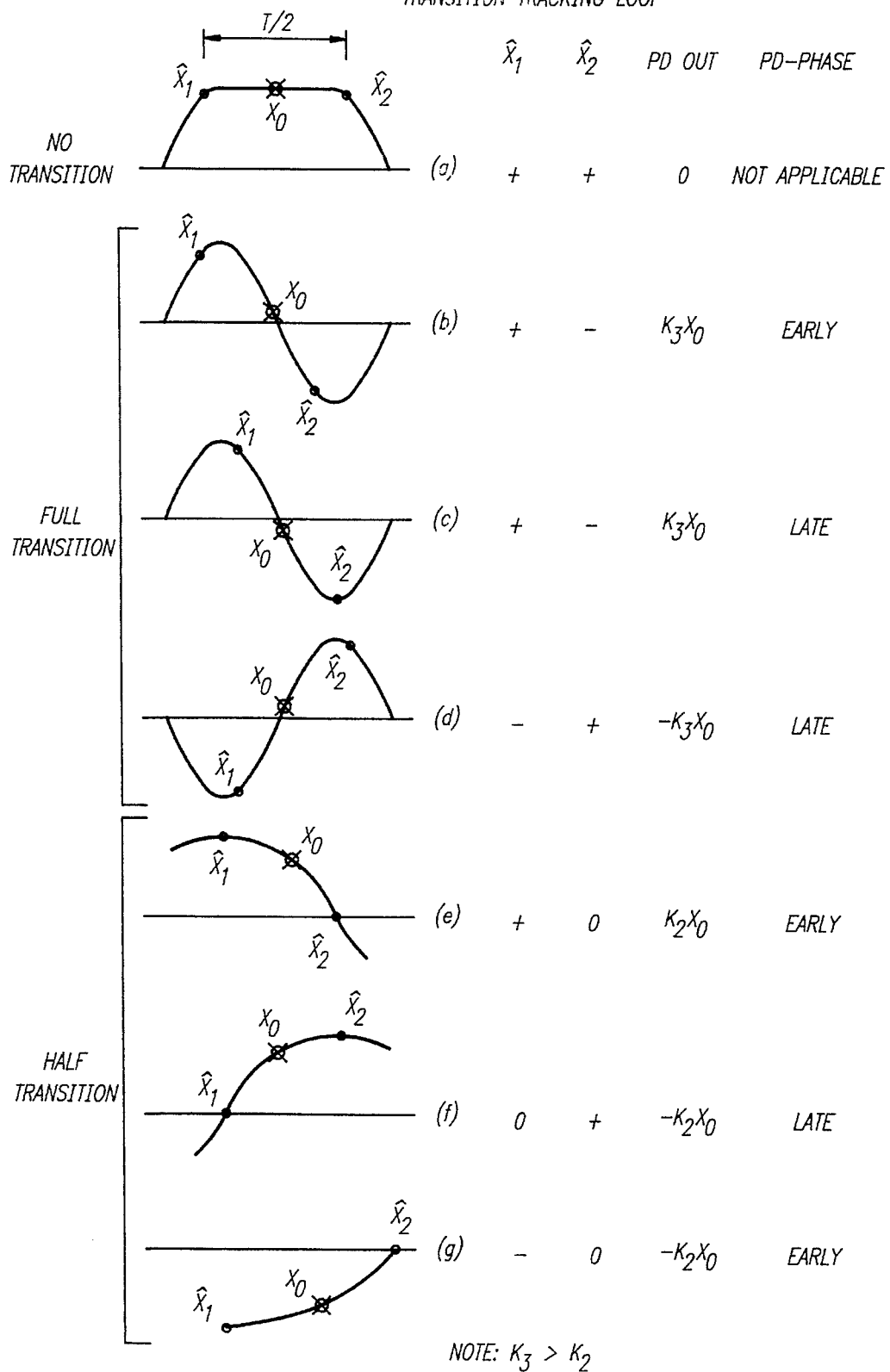

ETHERNET SYSTEM

This invention relates to systems for, and methods of, operating in local area networks to provide for the transmission and reception of signals through unshielded twisted pairs of wires between a computer and a hub. The invention particularly relates to systems for, and methods of, using digital techniques for enhancing the recovery, and the quality of such recovery, of the digital signals passing through the unshielded twisted pairs to the computer so that the information represented by such digital signals can be restored at the computer.

Systems now exist for passing information between different computers in a local area network. The systems include a hub connected to computers located at spaced positions around the hub. The connections between the hub and each computer are generally through unshielded twisted pairs of wires. These wires are generally made from copper so that they have relatively large losses. This has limited the distance through which the signals can pass between the hub and each computer. The unshielded twisted pairs of wires have also limited the rate at which the signals can be transmitted. Until relatively recently, the distance between the hub and each computer has been limited to approximately one hundred (100 m.) and the rate of signal transmission has been limited to approximately 10 megabits per second (10 Mb/sec.).

The systems discussed in the previous paragraph and constituting the prior art have used analog techniques at the computer to recover the information represented by the digital signals. For example, the systems of the prior art have used analog equalizers to compensate for deteriorations in the characteristics of the digital signals as the digital signals pass through the unshielded twisted pairs of wires. These analog techniques have been satisfactory when the signals have passed through the unshielded twisted pairs of wires at a frequency of ten megabits per second (10 Mb/sec.)

The amount of information being transmitted through the unshielded twisted pairs of lines has been increasing at a relatively rapid rate. To provide for this increased transmission of information, the rate of transmission has been increased to one hundred megabits per second (100 Mb/sec.). The increased rate of signal transmission has prevented analog equalizers from operating effectively in restoring at the computer the signals transmitted from the hub.

Digital circuits have been considered for use in systems employing unshielded twisted pairs of wires and transmitting signals at one hundred megabits per second (100 Mb/sec) through distances as great as one hundred meters (100 m.). For example, digital adaptive equalization technology has been considered for such systems. However, such digital systems have been rejected for several reasons. One reason has been that the systems considered have not provided significantly enhanced performance. Furthermore, the complexity of such systems has been quite high, particularly in relation to any enhanced performance obtained from such systems. The cost of such digital systems has also been considered to be excessive.

This invention provides a system for, and method of, receiving at a computer packets of digital signals transmitted from a hub displaced by a distance of as much as one hundred meters (100 m.) from the computer and for recovering the information represented by the digital signals in the packets. The system and method of this invention provide for such recovery whether the digital signals are transmitted through the wires at a frequency of ten megabits per second (10 Mb/sec.) or one hundred megabits per second (100 Mb/sec).

The system of this invention includes a digital adaptive equalizer for recovering the information represented by the digital signals in the packets. This equalizer is of an advanced design and includes feedback techniques to enhance the resolution provided by the equalizer in determining the amplitude level of each of the digital signals in each packet. The system and method of this invention are particularly adapted to operate with four (4) unshielded twisted pairs of wires, three (3) of the four (4) transmitting information whether the transmission is from the hub to the computer or from the computer to the hub. The system and method of this invention also include circuits and techniques for synchronizing the operation of the equalizer with the digital signals in the packets to enhance the recovery of the amplitudes of the digital signals by the equalizer.

In one embodiment of the invention, four (4) unshielded twisted pairs of wires connect a hub and a computer in an Ethernet system: one (1) pair of transmission only, another for reception only and the other two (2) both for transmission and reception. The signals in the wires are in packets each initially having timing signals defining a preamble and thereafter having digital signals representing information as by individual ones of three (3) amplitude levels.

The signals received at the computer are provided with an automatic gain control (AGC) and then with digital conversion at a particular rate. A control loop operative upon the digital conversions regulates the AGC gain at a particular value. An equalizer operative only during the occurrence of the digital signals representing information in each packet selects an individual one of the three (3) amplitude levels closest to the amplitude of each digital conversion at the time assumed to constitute the conversion peak.

The amplitudes of the timing signals in each preamble at the times assumed to constitute the peaks and zero crossings of such signals are multiplied. The rate of such digital conversions is adjusted in accordance with the polarity and magnitude of the multiplication product. The relative amplitudes of the successive equalizer values following each preamble are evaluated at the times assumed to be the peaks of the digital conversions. The rate of the digital conversions is adjusted in accordance with such evaluations, thereby further regulating the digital conversions at the particular rate. The equalizer thus operates on the information signals in each packet at the signal peaks.

In the drawings:

FIG. 5 shows the relationship of timing signals in a preamble in each packet and of digital signals following the preamble and representing information or data, the packets being shown in three (3) different channels;

FIG. 6 is a circuit diagram in block form of the stages at a computer for transmitting or receiving signals in a packet, the circuit diagram including stages in the receiver unique to this invention;

FIG. 8 is a curve illustrating the operation of a digital adaptive equalizer included in the circuit diagram shown in FIG. 7;

Figure 7:
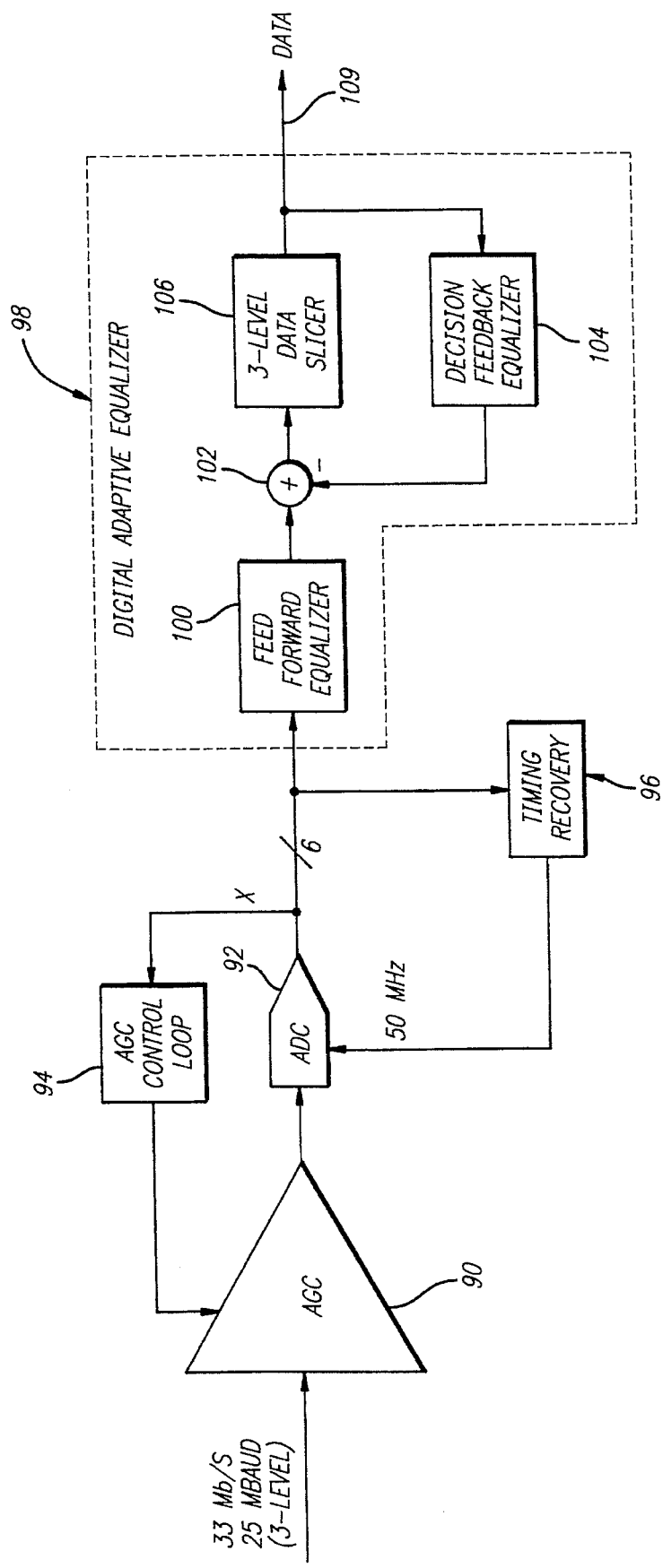
FIG. 7 is a circuit diagram in block form of stages included in the receiver at the computer and unique to this invention.
Figure 10C:
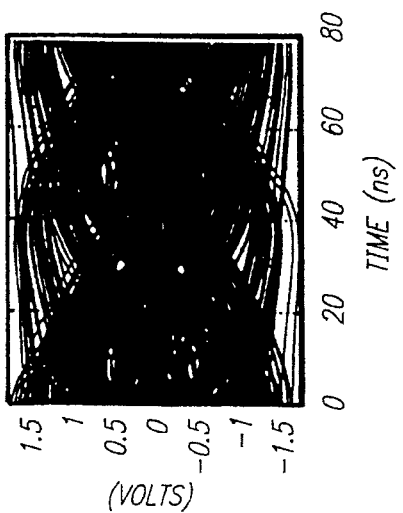
Figure 10B:
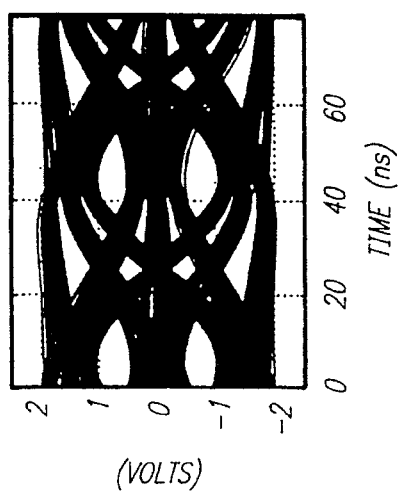
Figure 10A:
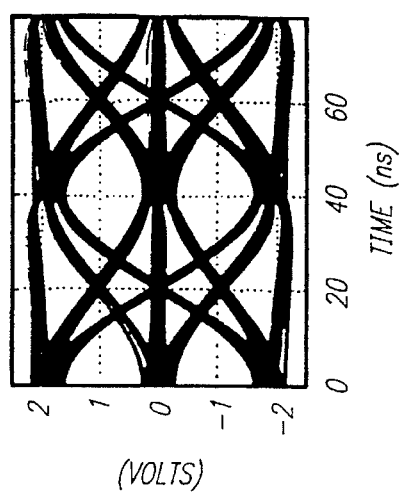
Figure 11:
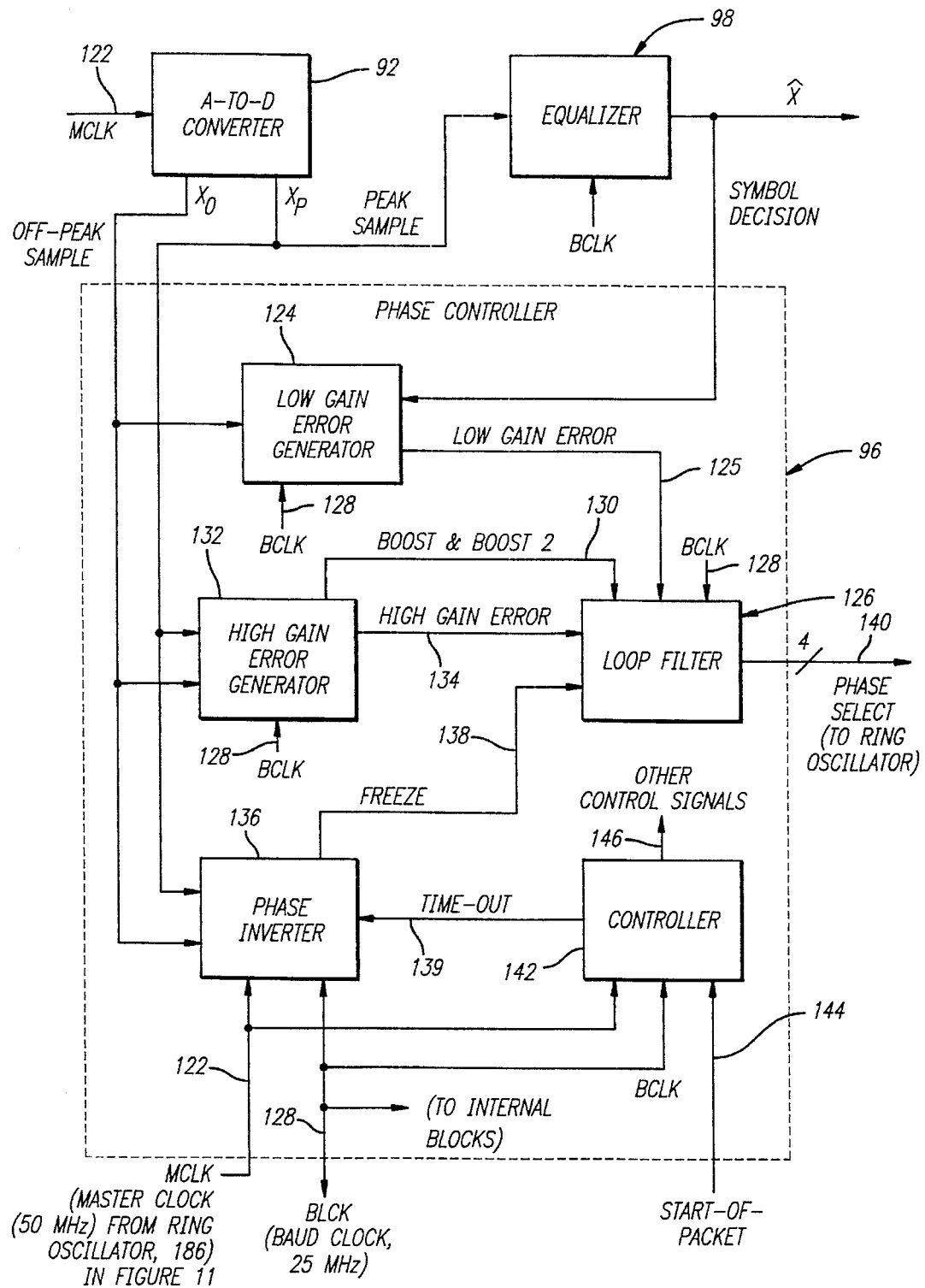
Figure 16:
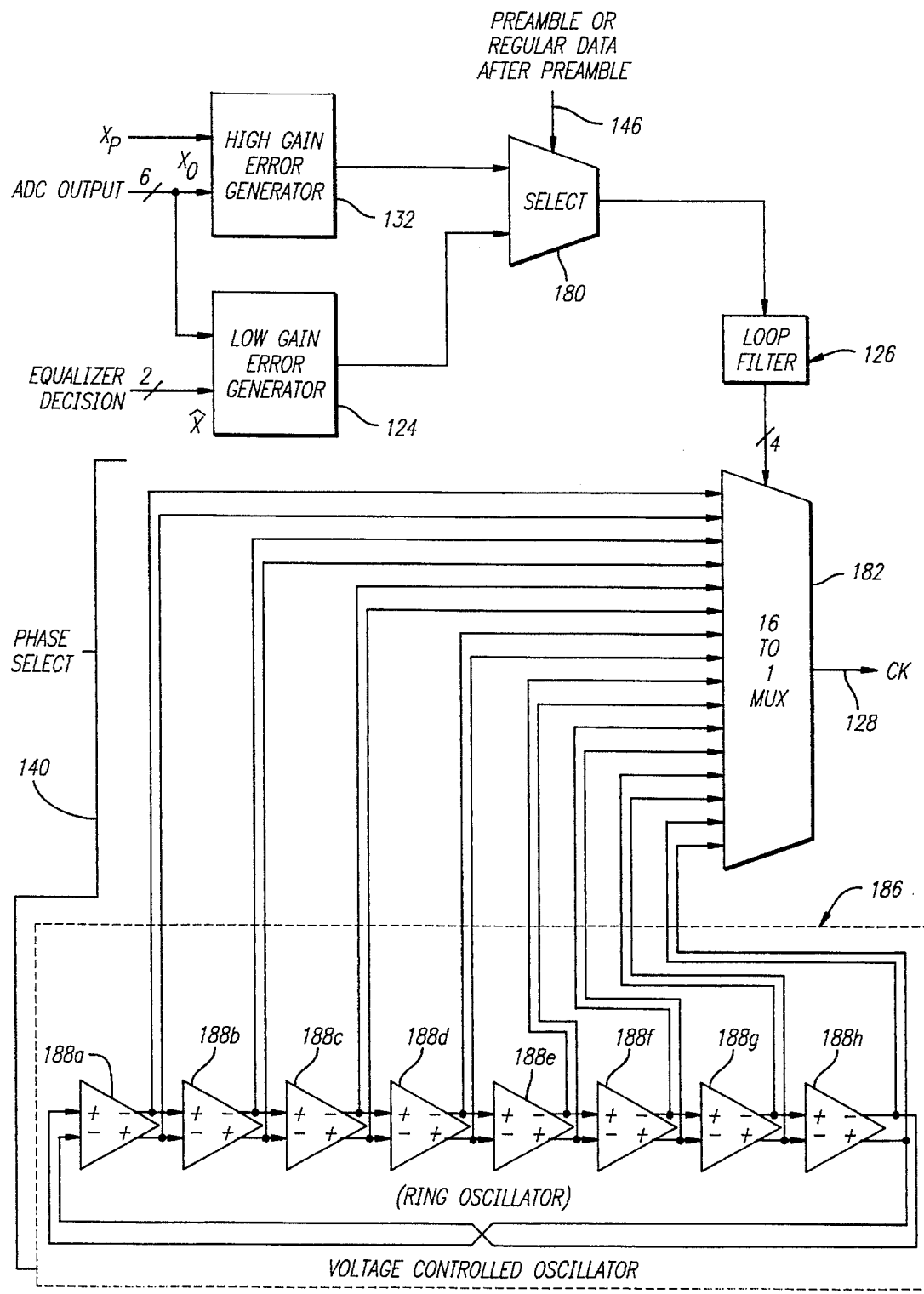

FIGS. 10(a), 10(b) and 10(c) respectively show the progressive deterioration, at distances of thirty meters (30 m.), sixty meters (60 m.) and one hundred meters (100 m.) along an unshielded twisted pair of wires, of the digital signals following the preamble in each packet and representing information or data;

FIG. 11 is a circuit diagram showing in additional detail the system shown in FIG. 7 with particular emphasis on a detailed construction of a block designated as "timing recovery" in FIG. 7;

FIGS. 12(a) and 12(b) show curves indicating the relative times of occurrence of the timing signals in the preamble in each packet when relatively small phase corrections have to be made in an analog-to-digital (A-D) converter shown in FIGS. 7 and 11;

FIG. 13(a)–13(d) show curves indicating the relative times of occurrence of the timing signals in the preamble in each packet when relatively small (FIGS. 13a–13b) and relatively large phase corrections (FIG. 13c–13d) have to be made in the analog-to-digital (A-D) converter shown in FIGS. 7 and 11;

FIG. 14 shows curves indicating the relative times of occurrence of successive ones of the digital signals following the preamble in each packet when corrections have to be made in the A-D converter to compensate for jitters that may occur in the digital conversions from the A-D converter;

FIG. 15 is a circuit diagram in block form of a loop filter shown in FIG. 11 and shows the construction of the loop filter in additional detail; and FIG. 16 is a circuit diagram in block form of some of the stages in FIG. 11 and also shows the interrelationship between these stages and a ring oscillator which adjusts the phase of the digital conversions from the A-D converter shown in FIGS. 7 and 11.

Figure 1:
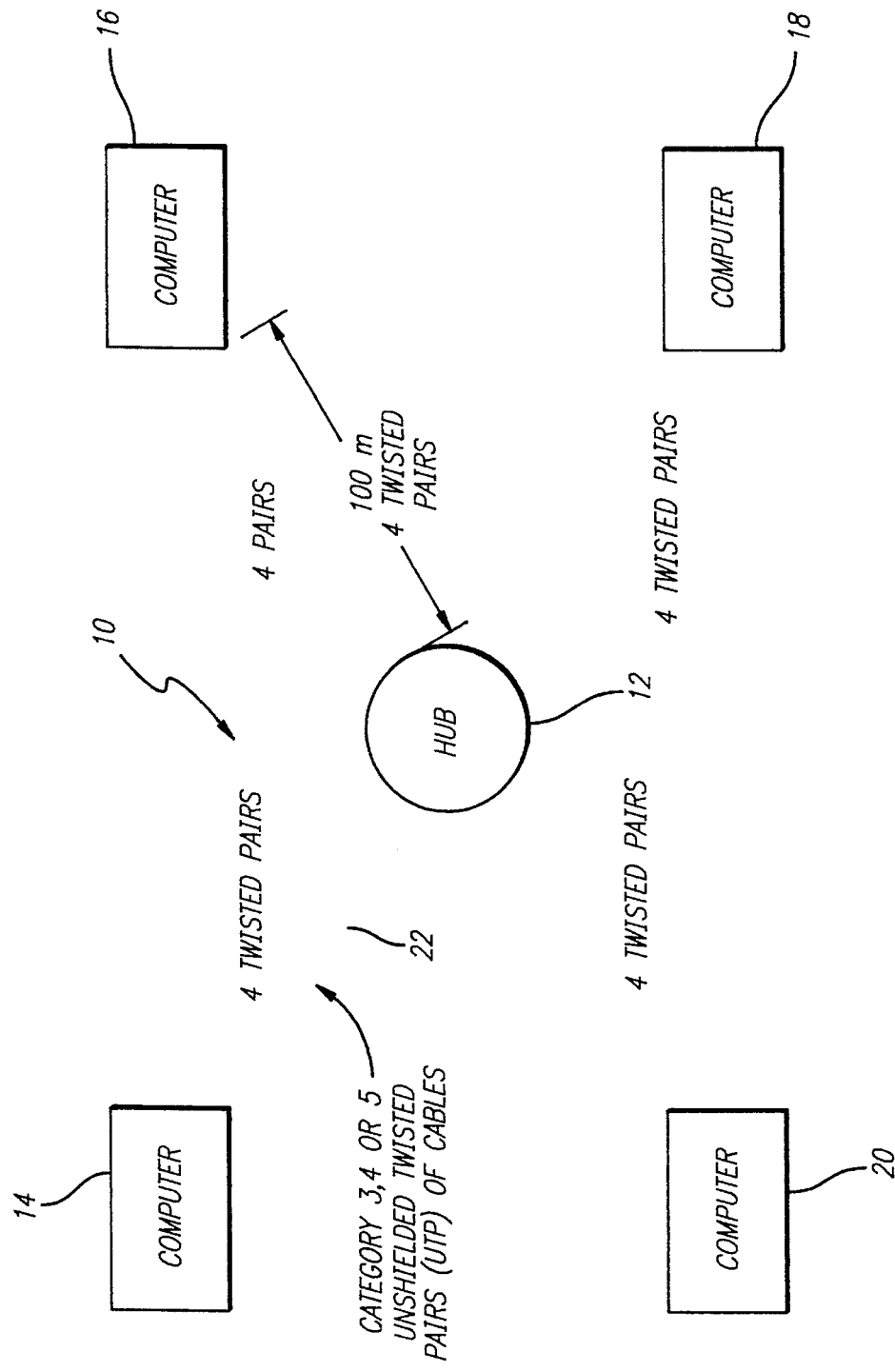
FIG. 1 is a schematic block diagram of an Ethernet system providing a plurality of computers connected to a hub by unshielded twisted pairs of wires to form a local area network (LAN)

An Ethernet system incorporating the features of this invention is generally indicated at 10 in FIG. 1. The Ethernet system 10 includes a hub 12 and a plurality of computers serviced by the hub in a local area network (LAN). Four computers 14, 16, 18 and 20 are shown by way of illustration but a different number of computers may be used without departing from the scope of the invention. Each of the computers 14, 16, 18 and 20 may be displaced from the hub 12 by a distance as great as approximately one hundred meters (100 m.). The computers 14, 16, 18 and 20 are also displaced from each other. The Ethernet system is known shown in FIG. 1 in the prior art.

The hub 12 is connected to each of the computers 14, 16, 18 and 20 by unshielded twisted pairs of wires or cables. Generally, the wires or cables are formed from copper. Four (4) unshielded twisted pairs of wires are provided in the system 10 between each computer and the hub 12. For example, four (4) unshielded twisted pairs of wires 22 are provided between the hub 12 and the computer 14. The system shown in FIG. 1 is operative with several categories of twisted pairs of cables designated as categories 3, 4 and 5 in the telecommunications industry. Category 3 cables are the poorest quality (and lowest cost) and category 5 cables are the best quality (and highest cost).

Figure 2:
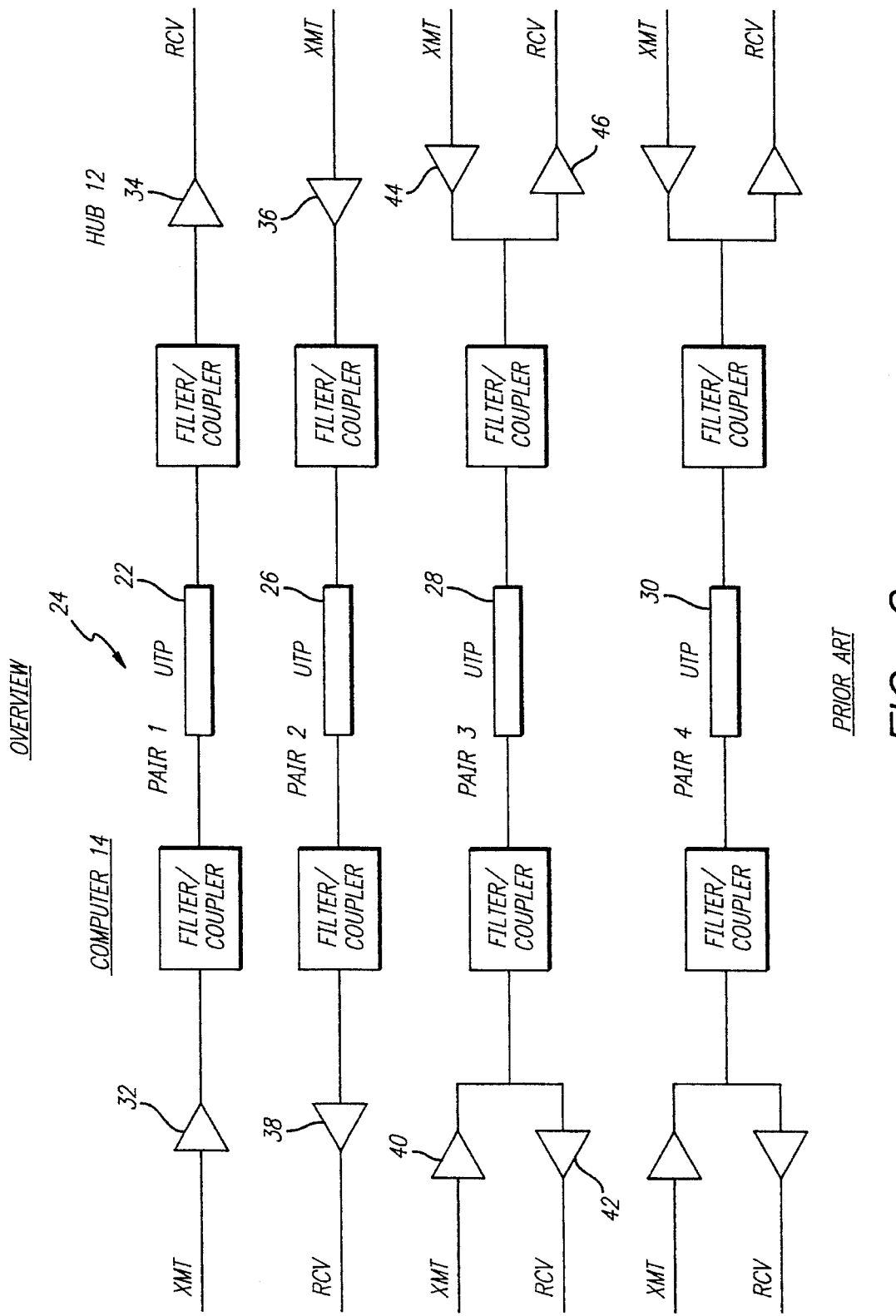
FIG. 2 is a circuit diagram in block form of an overview of the hub and one of the computers in FIG. 1, the circuit diagram showing such computer and such hub, and connections of the unshielded twisted pairs of wires between them, when the computer receives packets of signals from the hub or transmits packet of signals to the hub.

FIG. 2 provides an overview on a simplified basis of a system, generally indicated at 24, in which the features of this invention are incorporated. The system 24 as shown in FIG. 2 is known in the prior art. The system 24 provides for a transmission of digital signals between one of the computers (e.g. the computer 14) and the hub 12 and the reception of such signals at the other of the computer and the hub. A similar system can be provided for each of the computers 16, 18 and 20. The system includes four (4) unshielded twisted pairs (UTP) 22, 26, 28 and 30 of wires or cables. These unshielded twisted pairs of cable of respectively designated as Pair 1, Pair 2, Pair 3 and Pair 4 in FIG. 1.

An amplifier 32 at the computer 14 and an amplifier 34 at the hub 12 are connected to transmit digital signals through the unshielded twisted pairs 22 of wires only in the direction from the computer 14 to the hub 12. An amplifier 36 at the hub 12 and an amplifier 38 at the computer 14 are connected to transmit digital signals through the unshielded twisted pair 26 of wires only from the hub 12 to the computer 14.

Each of the unshielded twisted pairs 28 and 30 of wires or cables is connected to pass signals from the hub 12 to the computer 14 and also from the computer to the hub. This results from the connections of amplifiers 40 and 42 in opposite directions in the computer 14 to the unshielded twisted pairs 28 of wires or cables and from the connections of amplifiers 44 and 46 in opposite directions in the hub 12 to such unshielded twisted pairs of wires. Similar connections are made to the unshielded twisted pairs 30 of wires.

Figure 3:
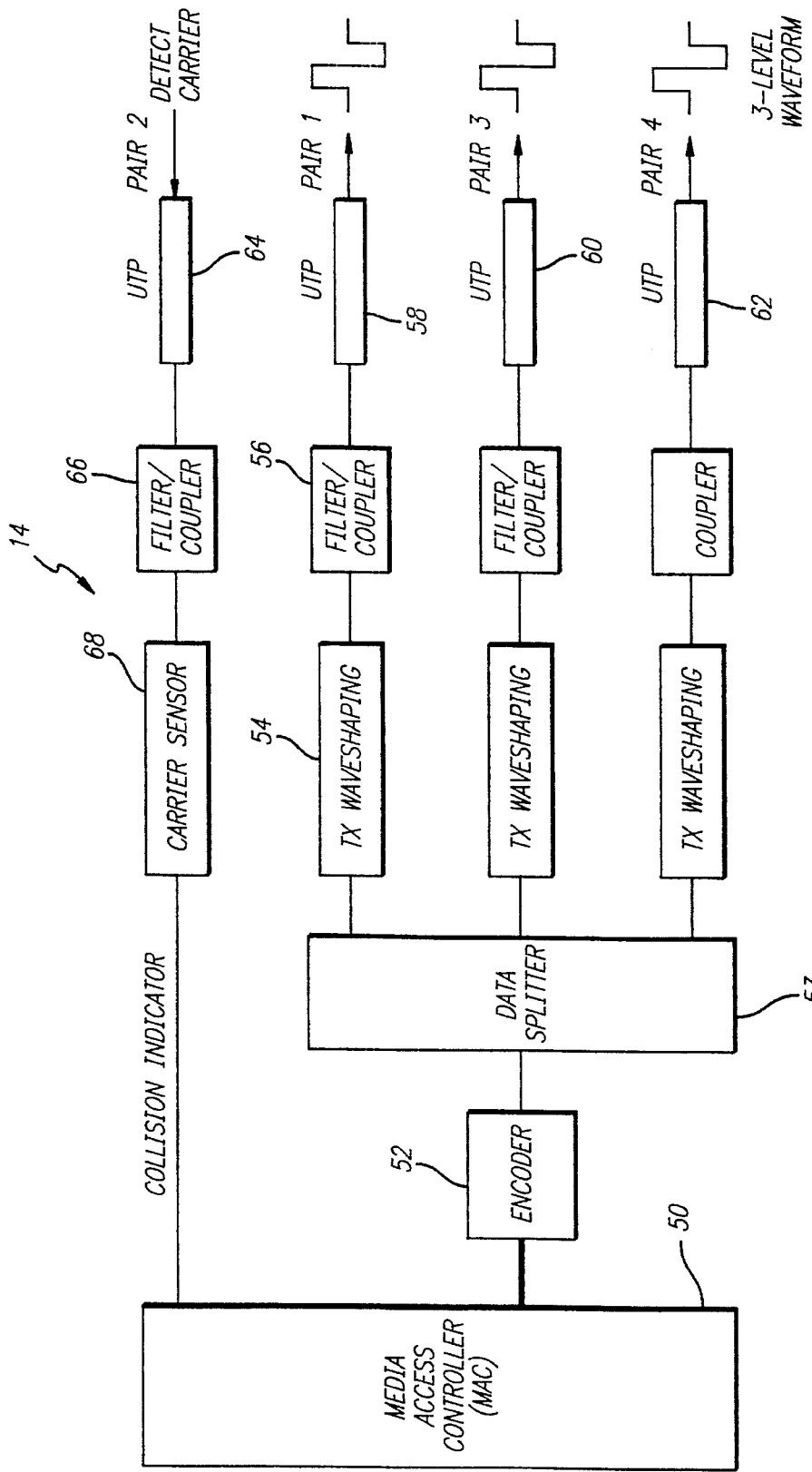
FIG. 3 is a circuit diagram showing in block form the construction of the computer, and the unshielded twisted pairs of wires connected to the computer, when the computer operates to send packets of signals through the unshielded twisted pairs of wires to the hub.

FIG. 3 provides an overview of the computer 14 when the computer operates as a transmitter. This overview is known in the art. It will be appreciated that similar overviews may be provided for each of the computers 16, 18 and 20 when these computers operate as transmitters. As shown in FIG. 3, the computer 14 includes a media access controller 50. The controller 50 becomes operative when the computer 14 is simultaneously attempting to transmit and receive packets of signals. At such a time, the controller 50 provides a selective priority to the signals being received or to the signals being transmitted. Preferably the priority may be to the packets of signals being received since these packets of signals may otherwise be lost.

The signals to be transmitted are introduced to an encoder 52 which encodes each of the signals to one (1) of three (3) amplitude levels dependent upon the information represented by such signal. The encoding of the signals to the individual ones of the three (3) amplitude levels effectively provides a reduction in the frequency of the signals. The signals then pass to a data splitter 53 which operates as a demultiplexer to pass the signals in successive packets into successive ones of three (3) channels on a cyclic basis. This causes the frequency of the signals in the packets in each of the channels to be reduced to one third (⅓) of the frequency of the packets of signals from the encoder 52.

One of the three (3) channels in FIG. 3 includes stages 54 for shaping the waves of the transmitted signals and also includes a filter/coupler 56 for limiting the frequency of the signals and for coupling the filtered signals to an unshielded twisted pair (UTP) 58 (designated as Pair 1) of wires. Each of the other two channels also includes wave shaping stages and filter/couplers respectively corresponding to the stages 54 and 56 in FIG. 3. These stages respectively introduce signals to unshielded twisted pairs 60 (designated as Pair 3) and 62 (designated as Pair 4).

In addition to passing through the unshielded twisted pairs 60 and 62 of wires on cables, the signals received by the computer 14 pass through an unshielded twisted pair 64 (designated as Pair 2), a filter/coupler 66 and a carrier sensor 68 to the media access controller 50 to activate the media access controller when a collision in the computer 14 between transmitted and received signals is about to occur.

Figure 4:
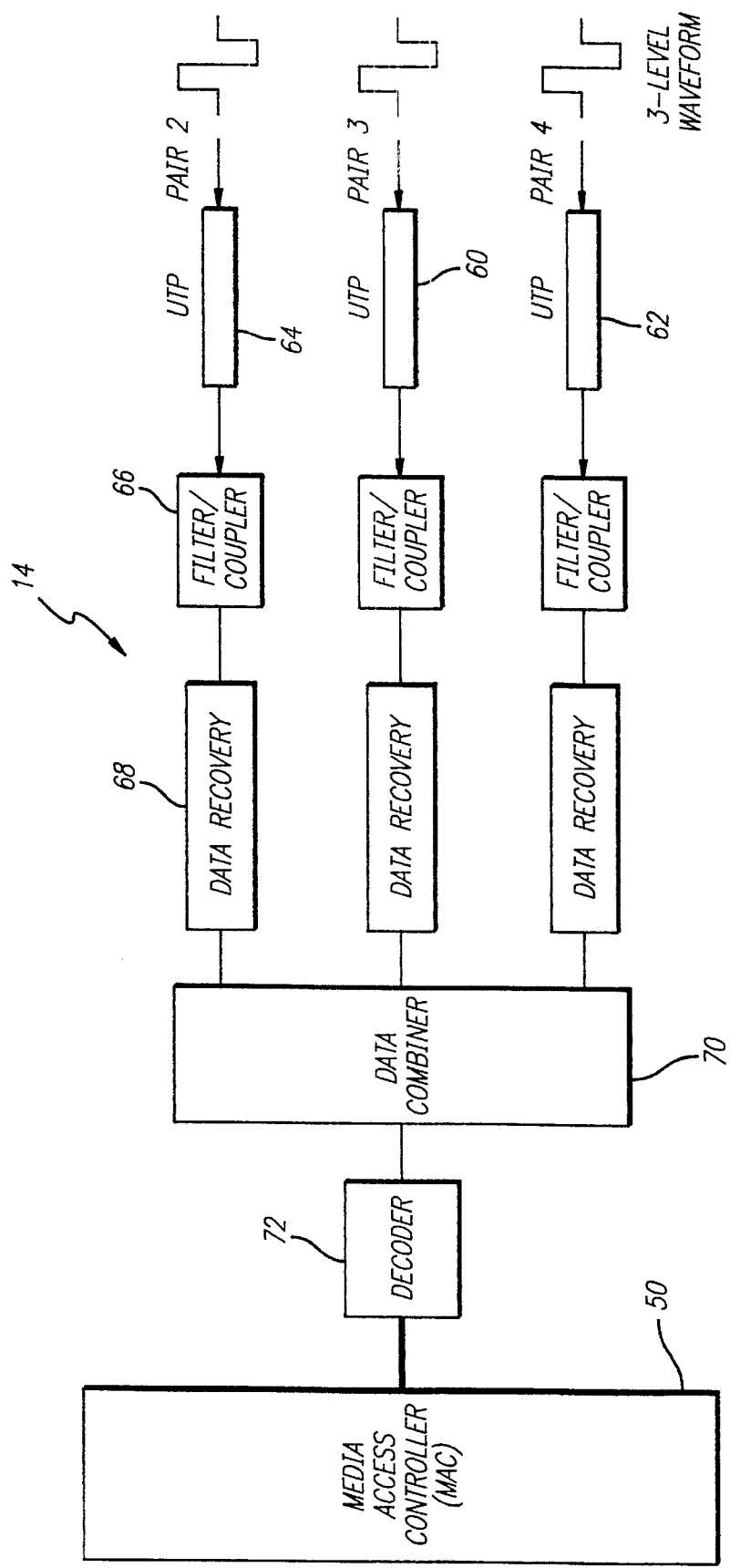
FIG. 4 is a circuit diagram showing in block form the construction of the computer, and the connections of the unshielded twisted pairs of wires to the computer, when the computer operates to receive and decode packets of signals passing through the unshielded twisted pairs of wires from the hub.

FIG. 4 provides an overview of the computer 14 when the computer operates as a receiver. This overview is known in the art. It will be appreciated that similar overviews may be provided for each of the computers 16, 18 and 20 when these computers operate as receivers. As shown in FIG. 4, the packets of signals are received on the unshielded twisted pairs 64 (Pair 2), 60 (Pair 3) and 62 (Pair 4) of wires. The packets of signals on the unshielded twisted pair 64 of wires are introduced to the filter/coupler 66 and then to the data recovery stage 68 which recovers the individual one of the three amplitude levels provided for each signal in each packet. The stages 64, 66 and 68 are also shown in FIG. 3. A filter/coupler and a data recovery stage are also provided for each of the channels respectively associated with the unshielded twisted pairs 60 and 62 of wires.

The signals from the data recovery stage 68 and the other two (2) data recovery stages are introduced to a data combiner 70 which acts as a multiplexer to recombine the signals in the three (3) received channels. A decoder 72 then recovers the information represented by the individual ones of the three (3) amplitude levels for the successive signals in the packets. The decoded signals then pass to the media access controller 50 also shown in FIG. 3.

As previously described, the signals in the unshielded twisted pairs 58, 60, 62 and 64 of wires or cables have a data rate of one hundred megabits per second (100 Mb/sec.). The rate of the transmission of such signals is at twenty five megabauds per second (25 Mbaud/sec.). The signals are in packets each having signals identifying the beginning of such packet and each having, after such identifying signals, a plurality of timing signals at the beginning of such packet.

The timing signals are provided in preambles in the packets. There may illustratively be eighteen (18) timing signals in each packet. Each of the timing signals has two (2) amplitude levels (positive and negative). The timing signals for the different packets are respectively illustrated at 76a, 76b and 76c in FIG. 5 for the channels 64 (Pair 2), 60 (Pair 3) and 62 (Pair 4). The timing signals are provided in preambles in the packets. The timing signals in each packet are followed by digital signals representing information or data. The digital signals in each packet have individual ones of three (3) amplitude levels to represent the information or data.

Although the digital signals representing the data in the packets have a frequency of one hundred megabits (100 Mb/sec.) per second, this frequency is reduced by the encoder 52 as a result of the conversion of the signals to three (3) amplitude levels. The frequency of such digital signals is also reduced by the data splitter 53 in FIG. 3 as previously described. The resultant digital signals in each of the unshielded twisted pairs 60, 62 and 64 of wires has a frequency of thirty three megabits per second (33 Mb/sec.).

FIG. 6 provides a simplified block diagram of a system constituting one embodiment of this invention for transmitting such signals from a computer such as the computer 14 through the unshielded twisted pairs of wires (e.g. the pairs 58, 60 and 62) to the hub and for receiving such signals through the unshielded twisted pairs (e.g. 60, 62 and 64) of wires at the computer from the hub and for processing such received signals at the computer to recover the information or data represented by such signals. The same block diagram (FIG. 6) also applies to each of the computers 16, 18 and 20.

The system shown in FIG. 6 includes the media access controller 50 (also shown in FIGS. 3 and 4), a stage 80 (which constitutes a combination of the encoder 52 and the data splitter 53 in FIG. 3) and transmitters 82a, 82b and 82c for passing the signals in the packets through the unshielded twisted pairs 58 (Pair 1), 60 (Pair 3) and 62 (Pair 4) of wires or cables in FIG. 3. The signals received from the hub 12 pass through the unshielded twisted pairs 64 (Pair 2), 60 (Pair 3) and 62 (Pair 4) of wires or cables in FIG. 4. These signals are respectively received by receivers and equalizers 84a, 84b and 84c. The receivers and equalizers 84a, 84b and 84c are included within the features of this invention. They operate on a digital basis to select the individual ones of the three (3) amplitude levels closest to the amplitudes of the received digital signals.

The signals from the receivers and equalizers 84a, 84b and 84c pass to a clock recovery stage 86 which operates upon these signals to recover a clock signal. The stage 86 is included within the features of this invention. This clock signal is used to synchronize the operation of the receivers and equalizers 84a, 84b and 84c and the data combiner and decoder 88. The clock signal from the stage 86 and the signals from the receivers and equalizers 84a, 84b and 84c are introduced to a stage 88 which constitutes a combination of the data combiner (or multiplexer) 70 and the decoder 72 in FIG. 4. The combination of the stages 84a, 84b, 84c, 86 and 88 is considered to be within the features of this invention. The signals from the stage 88 pass to the media access controller 50 also shown in FIGS. 3 and 4.

FIG. 7 illustrates one of three receiving and equalizing channels (see the receivers and equalizers 84a, 84b and 84c in FIG. 6) in the computer 14 in additional detail. It will be appreciated that each of the other two (2) receiving channels in the computer 14 may be constructed in the same or a similar manner. The same block diagram (FIG. 7) also applies to the receiving and equalizing channels in the computers 16, 18 and 20. The receiver and equalizer shown in FIG. 7 are unique to this invention. The receiver and equalizer shown in FIG. 7 include an automatic gain control stage (AGC) 90 which is connected to receive the signals passing through the unshielded twisted pair 64 of wires. The signals from the AGC stage 90 pass to an analog-to-digital (A-D) converter 92. The converter 92 provides digital conversions of the signals from the AGC stage 90 at a suitable frequency such as fifty megahertz (50 MHz), which is twice the baud rate of the signals.

The signals from the converter 92 pass to an AGC control loop 94. The signals from the AGC control loop 94 regulate the gain of the signals of the AGC stage 90 at a particular value. In this way, the amplitudes of the signals from the converter 92 are independent of any variation in the gain in the signals. The rate of production of the digital conversions is regulated by a timing recovery stage generally indicated at 96 so that the digital conversions of the signals from the stage 92 are at a particular rate and in a particular phase. The timing recovery stage 96 is shown in additional detail in subsequent Figures.

The output from the converter 92 is introduced to a digital adaptive equalizer generally indicated at 98 in FIG. 7. The stages in the digital adaptive equalizer 98 are shown within broken lines in FIG. 7. They include a feed forward equalizer 100 which is connected to the output of the A-D converter 92. A suitable feed forward equalizer for use as the equalizer 100 is disclosed in an article entitled "A 100 MHz, 5M Baud Decision Feedback Equalizer for Digital Television Applications" written by Robindra B. Joshi and Henry Samueli and published in the IEEE International Solid-States Circuits Conference on Feb. 16, 1994. The output of the feed forward equalizer 100 is introduced to an adder 102 as is the output from a decision feedback equalizer 104. The output from the adder 102 passes to a three (3)-level data slicer 106. The output from the data slicer 106 constitutes the input to the decision feedback equalizer 104. The output from the data slicer 106 also provides the data or information represented by the three (3)-level digital signals following the timing signals in the preamble in each packet. The output from the data slicer 106 is provided on a line 109.

The adder 102 adds the outputs of the feed forward equalizer 100 and the decision feedback equalizer 104 to provide an output which is introduced to the slicer 106. This addition may be seen from FIG. 8. As will be seen in FIG. 8, a composite signal generally indicated at 108 is shown as being comprised respectively of left and right halves 108a and 108b. The feed forward equalizer 100 may be considered to correct for distortions in the left half 108a of the composite signal 108 and the decision feedback equalizer 104 may be considered to correct for distortions in the right half 108b of the composite signal 108. The distortions result in part from the fact that the digital signals representing information or data in each packet develop tails as they travel through the unshielded twisted pairs of wires. As a result of the corrections for these distortions, the adder 102 provides the value of the amplitude of the composite signal 108.

The output from the adder 102 is introduced to the slicer 106 in FIG. 7. The slicer 106 provides a plurality (e.g. 3) of progressive amplitude values and determines the particular one of the three (3) amplitude values closest to the output from the adder 102. The slicer 106 provides this value on the line 109 for each of the digital signals in each packet to indicate the data or information represented by such digital signals. In this way, the digital adaptive equalizer 98 restores the analog levels of the digital signals in the packets at the receiver to the analog levels of these digital signals at the hub 12 even with the distortions produced in these signals as they pass through the unshielded twisted pairs of wires.

Figure 9:
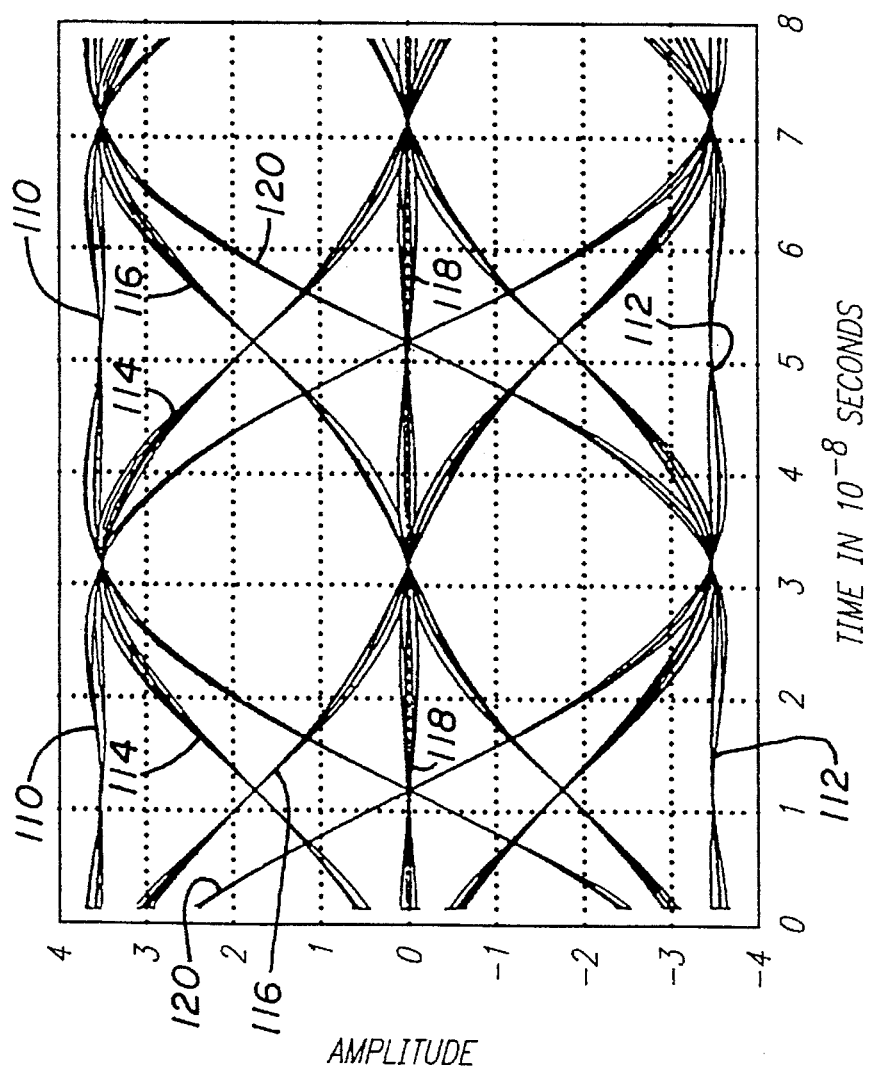
FIG. 9 shows curves of different patterns of successive digital signals in the packets when the digital signals have individual ones of the three (3) amplitude levels and have a frequency of twenty five megahertz (25 MHz)

FIG. 9 shows curves of different patterns of successive digital signals in the packets when the digital signals have individual ones of the three (3) amplitude levels and have a frequency of twenty five megahertz (25 MHz). In FIG. 9, time in $10^{-8}$ seconds is shown along the horizontal axis and relative amplitudes in positive and negative polarities are shown along the vertical axis. For example, three successive amplitude levels of +1, +1 and +1 are indicated at 110 in FIG. 9 and three successive amplitude levels of −1, −1 and −1 are indicated at 112 in that Figure. Similarly, three (3) successive amplitude levels of 0, +1 and 0 are indicated at 114 in FIG. 9 and three (3) successive amplitudes of +1, 0 and +1 are indicated at 116 in that Figure. Three successive amplitude levels of 0, 0, 0 are also indicated at 118 in FIG. 9 and three successive amplitudes of +1, −1 and +1 are also indicated at 120 in FIG. 1. FIG. 9 represents the desired (or perfect) wave forms for different combinations of three (3) successive digital signals in a packet.

FIGS. 10(a), 10(b) and 10(c) show the degradations in the signal combinations of FIG. 9 after the signals in such combinations have travelled different distances between the hub 12 and the computer 14. FIG. 10(a) shows the degradations in such signal combinations after the signals in such combinations have travelled a distance of approximately thirty meters (30 m.) through one of the unshielded twisted pairs 64, 60 and 62 of wires.

FIG. 10(b) shows the further degradations in such signal combinations after the signals in such combinations have travelled a distance of approximately sixty meters (60 m.) through one of such unshielded twisted pairs of wires. The degradation in such signal combinations is further aggravated after the signals in such combinations have travelled a distance of approximately one hundred meters (100 m.) through one of the unshielded twisted pairs 64, 60 and 62 between the hub 12 and the computer 14. This is shown in FIG. 10(c).

This invention recovers in the computer 14 the pattern of the successive signals transmitted through each of the unshielded pairs 64, 60 and 62 of wires from the hub 12 even after such signals have travelled a distance of approximately one hundred meters (100 m.) from the hub and have suffered the degradation shown in FIG. 10(c). As will be seen, clearing up the signal confusion shown in FIG. 10c to restore the signals shown in FIG. 9, as by the system of this invention, constitutes a significant achievement.

FIG. 11 is a circuit diagram showing in additional detail the system shown in FIG. 7 with particular emphasis on the construction of the timing recovery block 96 in FIG. 7. The system shown in FIG. 11 includes the A-D converter 92 and the equalizer 98 also shown in FIG. 7. The A-D converter 92 receives on a line 122 clock signals at the master clock frequency of fifty megahertz (50 MHz). The A-D converter 92 provides outputs at the times assumed to be the peaks and zero crossings of the digital conversions from the converter 92. The outputs from the A-D converter 92 are used in the system shown in FIG. 11 to adjust the phase of the master clock frequency so that the signals will actually be produced at the peaks and zero crossings of the master clock signals. The output at the time assumed to be the peak of the digital conversions is designated as "$x_p$" in FIG. 11 and the output at the time assumed to be the zero crossing is designated as "$x_o$" in FIG. 11

The signal $x_p$ from the converter 90 is shown in FIG. 11 as being introduced to the equalizer 98. As previously described, the equalizer 98 operates upon the signal $X_p$ to select the individual one of the three (3) amplitude levels closest in amplitude to the signal $x_p$. This amplitude level is designated in FIG. 11 as "$\hat{x}$". The signal $\hat{x}$ from the equalizer 98 is introduced to a low gain error generator 124 which is included within the timing recovery block 96 also shown in FIG. 7. The stages included in the timing recovery block 96 are disposed within a rectangle shown in broken lines in FIG. 11. This recovery block is generally indicated at 96 in FIGS. 7 and 11. The low gain error generator 124 also receives the $x_o$ output from the A-D converter 92 and provides an output, designated as a "low gain error", on a line 125 to a loop filter generally indicated at 126 and included within the timing recovery block 96.

The loop filter 126 also receives clock signals on a line 128 at a baud clock rate of twenty five megahertz (25 MHz). The loop filter 126 additionally receives signals, designated as "boost & boost 2", on a line 130 from a high gain error generator 132. Signals designated as "high gain error" are introduced on a line 134 from the high gain error generator 132 to the loop filter 126. A phase inverter 136 provides signals (designated as "freeze") on a line 138 to the loop filter 126. The output from the loop filter 126 passes through a line 140 to a ring voltage controlled oscillator (or ring oscillator) generally indicated at 186 in FIG. 16 and shown in additional detail in FIG. 16.

The phase inverter 136 receives the clock signals on the line 122 at the master clock frequency of fifty megahertz (50 MHz) and clock signals at the baud clock frequency of twenty five megahertz (25 MHz). The clock signals on the line 128 also pass to internal blocks. The clock signals on the lines 122 and 128 also pass to a controller 142. The controller 142 also receives on a line 144 signals which indicate the start of each packet. These signals are provided in a special pattern at the beginning of each packet. The controller 142 provides other control signals on a line 146.

The signals $x_p$ and $x_o$ at the times respectively assumed to be the peaks and zero crossings of the timing signals 76a, 76b and 76c (FIG. 5) pass from the A-D converter 92 to the high gain error generator 132. FIG. 12 indicates the response of the high gain error generator 132 to the signals $x_p$ and $x_o$ generated during the occurrence of the timing signals in the preamble in each packet. The high gain error generator 132 multiplies the values of the signals $x_p$ and $x_o$ for each of the timing signals and determines from the multiplication product the correction, if any, which should be made in the times assumed for the peak $x_p$ and the zero crossing $x_o$ to occur.

When the product of $x_p$ and $x_o$ for a timing signal is zero, no correction has to be made since the time assumed by the baud clock signal on the line 128 to be the zero crossing for a timing signal is actually the time that the zero crossing has occurred. When the signal $x_p$ occurs at a time indicated at 148 in FIG. 12(a) and the signal $x_o$ occurs at a time indicated at 150 in FIG. 12(a), the product of $x_p$ and $x_o$ is positive. This indicates that the time assumed by the baud clock signal on the line 128 in FIG. 11 for the peak $x_p$ and the zero crossing $x_o$ to occur is early. As a result, the error generator 132 delays the phase of the baud clock signal on the line 128 in FIG. 11 so that the times assumed for the peak $x_p$ and the zero crossing $x_o$ to occur will approach the times that such peak $x_p$ and such zero crossing $x_o$ actually occur.

Figure 13A:
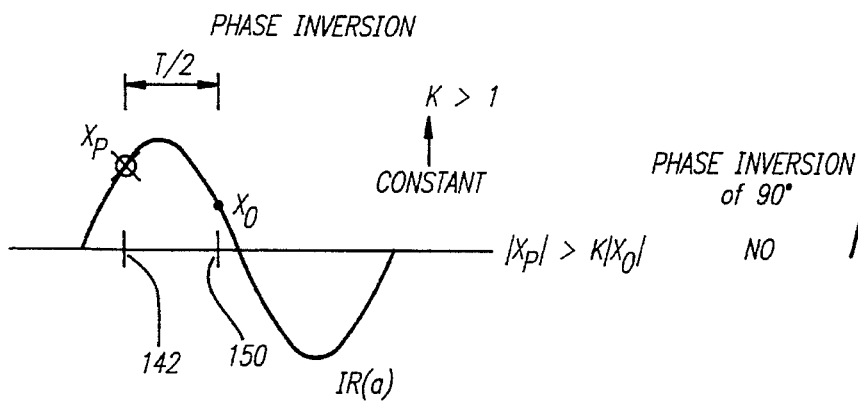
Figure 13B:
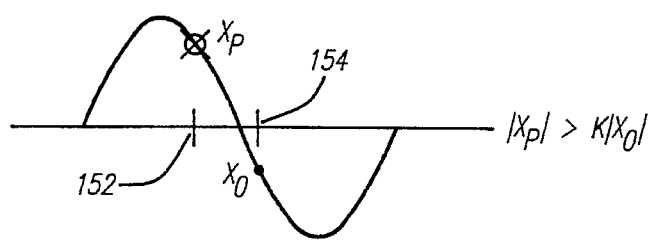

FIG. 13(b) provides another illustration of the times 152 and 154 respectively assumed for the peak $x_p$ and the zero crossing $x_o$ to occur in one of the timing cycles in the preamble of a packet. As will be seen, since $x_o$ has a negative polarity and $x_p$ has a positive polarity, the polarity of the product of $x_p$ and $x_o$ is negative. This indicates that $x_p$ and $x_o$ are occurring at a late time. The phases of the baud clock signals or the line 128 in FIG. 11 are accordingly shifted in a leading direction so that the times assumed for $x_p$ and $x_o$ to occur approach the time that $x_p$ and $x_o$ actually occur.

FIGS. 13(a) and 13(b) respectively show the same relationship in time between $x_p$ and $x_o$ as are shown in FIGS. 12(a) and 12(b). As will be seen in FIGS. 13(a) and 13(b) and also in FIGS. 12(a) and 12(b), a relatively small amount of a phase shift has to be made in the phase of the baud clock signals on the line 128 in FIG. 11 to bring the signal $x_p$ in synchronism with the peak of the baud clock signals actually occurring on the line 128 and to bring the zero crossing $x_o$ in synchronism with the zero crossing of the baud clock signals actually occurring on the line 128. This may be seen from the fact that $|x_p|>K|x_o|$ in FIGS. 13(a) and 13(b) where K is a constant gain factor having a relatively high value greater than 1.

Figure 13C:
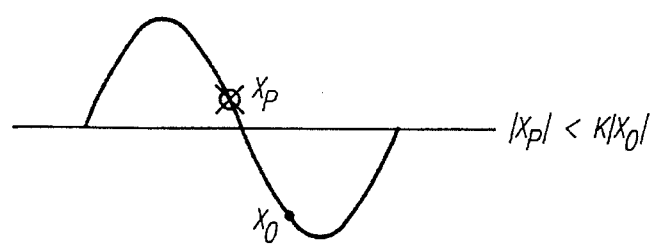
Figure 13D:
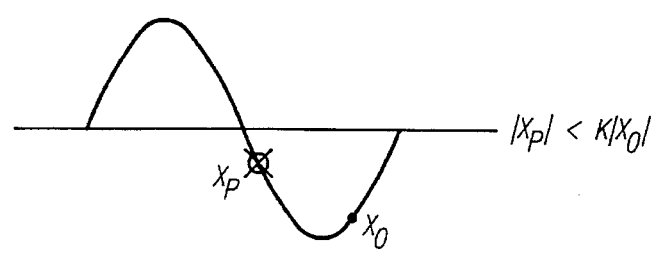

Sometimes, however, the baud clock signals on the line 128 are considerably out of synchronism with the signals $x_p$ and $x_o$ respectively assumed to constitute the peaks and zero crossings. This is shown in FIGS. 13(c) and 13(d). As will be seen in FIG. 13(c), the signals $x_p$ and $x_o$ are delayed relative to the baud clock signals on the line 128 by a phase angle less than, but approaching 90°. In FIG. 13(d), the signals $x_p$ and $x_o$ are delayed relative to the baud clock signals on the line 128 by a phase angle greater than 90°. In both of these instances, $|x_p|<K|x_o|$. In both of these situations, synchronization between the baud clock signals on the line 128 on the one hand and the peak signal $x_p$ and the zero crossing signal $x_o$ on the other hand will occur on an expedited basis when a phase shift (or phase inversion) of 90° is provided.

When the phase shift of 90° occurs in the time relationship shown in FIG. 13(c), the relative positions of the $x_p$ and $x_o$ signals in FIG. 13(c) will be shifted to the relative positions of these signals in FIG. 13(a). Similarly, the relative positions of the $x_p$ and $x_o$ signals in FIG. 13(d) will be shifted to the relative positions of these signals in FIG. 13(b) when a phase shift of 90° is provided in these signals. Relatively minor corrections can thereafter be provided in the phase of the clock signals to have $x_p$ correspond to the peak of the baud clock signals on the line 128 and to have $x_o$ correspond to the zero crossing of such baud clock signals.

The phase inverter 136 in FIG. 11 provides the phase shift of 90° discussed in the previous paragraph. The relationship shown in FIGS. 13(c) and 13(d) to create the phase inversion of 90° is advantageous because it minimizes false inversions resulting from large amplitudes of noise or from the trailing spikes that are produced as a result of the passage of the digital signals for a distance of one hundred meters (100 m.) through the unshielded twisted pair of wires.

Only one phase shift of 90° is provided during the preamble in each packet. This is indicated by the "freeze" indication on the line 138 in FIG. 11. The reason for this is that more than one such phase shift in a preamble will tend to create instability in the effort to synchronize the baud clock signal on the line 128 with the peak signal $x_p$ and the zero crossing $x_o$ during the occurrence of the timing signals in the preamble in each packet.

Furthermore, the phase shifts in the clock signals on the line 128 in FIG. 11 are made only during a first limited number of timing signals in each preamble. This results from the introduction of a signal (designated as "time out") on a line 139 from the controller 142 to the phase inverter 136. For example, if there are eighteen (18) timing signals in each preamble, the phase shifts in the clock signals on the line 128 will preferably be made only in the first ten (10) timing signals in such preamble. This prevents large amplitudes of noise in the last eight (8) timing signals of a preamble from producing undesired phase shifts of 90° in the clock baud signals on the line 128. Such large phase shifts in the last timing signals in each preamble would tend to create instabilities, particularly when such large phase shifts result from the introduction of noise into the system.

Sometimes the gain of the signals from the converter 92 is relatively low. When the gain of the converter 92 as represented by the $x_p$ and $x_o$ signals is at least fifty percent (50%) below the dynamic range of the converter 92, a signal is introduced on the line 130 to the loop filter 126. This causes the loop gain to be doubled. The loop gain is doubled again when the gain of the converter 92 as represented by the $x_p$ and $x_o$ signals is below twenty five percent (25%) of the dynamic range of the converter 92.

The low gain error generator 124 provides error corrections during the occurrence of the digital signals following the timing signals in the preamble of each packet. These digital signals indicate the data or information in each packet. As a result of these error corrections, the phase of the digital conversions by the A-D converter 90 is regulated so that the signal $x_o$ occurs at the zero crossings of the digital signals following the preamble in the packet and the signal $\hat{x}$ from the equalizer 98 represents the peak of such digital signals.

The low-gain error generator 124 provides such phase regulation by operating upon successive ones of the digital signals. This may be seen from FIG. 14. In FIG. 14, two successive indications from the equalizer 98 are indicated as $\hat{x}_1$ and $\hat{x}_2$. The zero crossing between the two (2) successive indications $\hat{x}_1$ and $\hat{x}_2$ is indicated as $x_o$. The low gain error generator 124 in FIG. 11 adjusts the phase of the signals from the A-D converter 92 on the basis of the relative values of $\hat{x}_1$, $x_o$ and $\hat{x}_2$ to eliminate any jitter in the phase of the digital signals from the A-D converter.

FIG. 14(a) indicates a situation where $\hat{x}_1$, $x_o$ and $\hat{x}_2$ have no transition. Under such circumstances, no change is made in the phase of the signals produced by the A-D converter 92, particularly since it is difficult to determine what, if any, correction should be made. FIG. 14(b) indicates a situation where $\hat{x}_1$ is positive and $\hat{x}_2$ is negative and $x_o$ occurs before the zero crossing. Under such circumstances, the zero crossing occurs early. A phase adjustment based upon $K_3 x_o$ is made in the signals from the A-D converter 92 to delay the phase so that $x_o$ will occur at the zero crossing. In the phase adjustment of $K_3 x_o$, $K_3$ is a constant gain factor. The value of $K_3$ is less than the value of the constant gain factor K for the situations shown in FIGS. 12(a) and 12(b) and described above.

FIGS. 14(c) and 14(d) indicate situations where $x_o$ is late relative to the zero crossing. In FIG. 14(c), $\hat{x}_1$ is positive, $x_o$ is negative and $\hat{x}_2$ is negative. In FIG. 14(d), $\hat{x}_1$ is negative, $x_o$ is positive and $\hat{x}_2$ is positive. In the situations of both FIGS. 14(c) and 14(d), the A-D converter 92 delays the phase of the digital conversions produced by the A-D converter so that $x_o$ will occur at the zero crossings. In both FIGS. 14(c) and 14(d), $K_3$ is the constant gain factor for advancing the phase of the digital conversions by the A-D converter 92.

As will be seen, FIGS. 14(b), 14(c) and 14(d) indicate transitions in $\hat{x}_1$ and $\hat{x}_2$ between positive and negative values. Such transitions are accordingly designated in FIG. 14 as "Full Transitions". FIGS. 14(e), 14(f) and 14(g) indicate half transitions. In other words, $\hat{x}_1$, $x_o$ and $\hat{x}_2$ have progressive values between a peak and a zero crossing or between a zero crossing and a peak without changing polarity. The transitions in FIGS. 14(e), 14(f) and 14(g) are accordingly designated as "Half Transitions" in FIG. 14.

In FIG. 14(e), the transition is between a positive peak for $\hat{x}_1$ and a zero value for $\hat{x}_2$. In FIG. 14(f), the transition is between a zero value for $\hat{x}_1$ and a positive peak for $\hat{x}_2$. In FIG. 14(g), the transition is between a negative peak for $\hat{x}_1$ and a zero value for $\hat{x}_2$. In each instance, the value of $x_o$ is between the peak and the zero value.

Since only half transitions are involved in FIGS. 14(e), 14(f) and 14(g), a constant gain factor $K_2$ is chosen that is less than the constant gain factor $K_3$ for the change in the phase of the digital conversions from the A-D converter 92 as in FIGS. 14(b) and FIG. 14(c). In FIG. 14(e), the digital conversion by the A-D converter 92 is early so that the phase of the digital conversion is delayed to have $x_o$ occur at the zero crossing. In FIG. 14(f), the digital conversion by the phase detector 92 is late so that the phase of the digital conversion is advanced to have $x_o$ occur at the zero crossing. Similarly, the digital conversion by the phase detector 90 is delayed in FIG. 14(g) to have $x_o$ occur at the zero crossing.

The signals from the high gain error generator 132 and the low gain error generator 124 in FIG. 11 are introduced to the loop filter 126 shown as a block in FIG. 11. The loop filter 126 operates in synchronism with the baud clock signals of twenty five megahertz (25 MHz) on the line 128. The loop filter 126 is shown in additional detail, but on a block diagram basis, in FIG. 15. It includes a line 170 which is schematically intended to indicate, on a generic basis, any of the line 125 (FIG. 11) from the low gain error generator 124, the line 134 from the high gain error generator 132 or the line 138 from the phase inverter 136.

The signals on the line 170 in FIG. 15 are multiplied in an amplifier 172 which provides an amplification generically indicated at $K_G$. The amplification factor $K_G$ for the amplifier 172 may respectively be $K_3$ or $K_2$ if the signals on the line 170 are provided from the line 125 (FIG. 11) or the amplification factor may be K if the signals on the line 170 are provided from the line 134 in FIG. 11.

The signals from the amplifier 172 in FIG. 15 pass to an adder 174 which also receives signals from the output of a register 176. The output from the adder 174 is introduced to the register 176. The output from the register 176 is introduced on the line 140 in FIGS. 11 and 15 to a voltage controlled oscillator (or ring oscillator) 186 in FIG. 16. The register 176 accumulates the signals from the amplifier 172 by the addition in the adder 174 of the signals from the amplifier and the register.

FIG. 16 shows the low gain error generator 124 and the high gain error generator 132 which are also shown in FIG. 11. The signals from the error generators 124 and 132 are introduced in FIG. 16 to a select stage 180 which may constitute a multiplexer. The operation of the select stage 180 is controlled by signals on the line 146 (also shown in FIG. 11) from the controller 142 to indicate whether the signals in the packet at each instant are the timing signals in the preamble or the information or data signals following the preamble. The signals from the select stage 180 in FIG. 16 pass through the loop filter 126 (also shown in FIG. 11) to a multiplexer 182, the output of which constitutes the baud clock signals on the line 128 (also shown in FIG. 11).

The multiplexer 182 receives the signals from the voltage controlled oscillator 186 and shown within broken lines in FIG. 16. The voltage controlled oscillator includes a plurality of amplifiers in a ring relationship. Preferably sixteen (16) amplifiers are included in the ring relationship but only eight (8) amplifiers 188a, 188b, 188c, 188d, 188e, 188f, 188g and 188h are shown in FIG. 16 since they provide differential outputs. The output of each amplifier in the sequence is connected to the input of the next amplifier in the sequence and the output of the last amplifier 188h in the sequence in FIG. 15 is connected to the input of the first amplifier 188a in the sequence.

Each packet has signals in a unique pattern to indicate the beginning of the packet. The controller 142 (FIG. 11) senses this unique pattern of signals on the line 144 to indicate the beginning of the packet. The controller 142 then produces a signal on the line 146 (FIGS. 11 and 16) to indicate whether the signals in the packet are the timing signals in the preamble or the digital signals following the preamble and representing information or data.

When the signal on the line 146 indicates the occurrence of the timing signals, the signals from the high gain error generator 132 in FIG. 11 and 16 pass through the select stage 180 and the loop filter 126 in FIG. 16 to the multiplexer 182. These signals activate the multiplexer 182 to pass the signals from one of the amplifiers 188a–188h. By selecting on the line 140 a different one of the amplifiers 188a–188h in each cycle, the phase of the clock signals on the line 128 is adjusted in accordance with the characteristics of the signals from the high gain error generator 132. The phase-adjusted clock signals are introduced to the A-D converter 92 (FIG. 7) to obtain the generation of the digital conversions by the converter.

Except for the instances where a phase inversion is provided, the phase adjustment in each cycle is limited to a particular magnitude. For example, when sixteen (16) amplifiers are provided in the ring oscillator 186, each phase adjustment may be limited to that provided by two (2) successive amplifiers in the ring oscillator 186. This enhances the stability in adjusting the phase of the clock signals on the line 128 so that the signal $x_o$ occurs at the zero crossing of the clock signals.

When a phase inversion of 90° occurs, an adjustment in the phase of the clock signals on the line 128 in FIG. 11 is not made at the same time as a result of the operation of the high gain error generator 132. This enhances the stability in the phase adjustments. An adjustment in the phase of the clock signals is also not made during the time between the occurrence of the successive packets.

When the signal on the line 146 in FIGS. 11 and 16 indicates the occurrence of the digital signals representing the information or data in a packet, the select stage 180 passes a signal to the loop filter 126 to provide a gain of $K_3$ or $K_2$ in the loop filter depending upon the relative characteristics of the curve represented by $\hat{x}_1$, $x_o$ and $\hat{x}_2$ in FIG. 14. The multiplexer 182 then selects one of the amplifiers 188a–188g for the passage of a signal to the clock line 128 in accordance with the operation of the loop filter 126.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for use in a system providing signals having individual ones of a plurality of analog levels to represent information, a hub, a plurality of computers, a plurality of pairs of twisted wires, each plurality being disposed between the hub and an individual one of the computers to transmit signals between the individual one of the computers and the hub, each of the computers including a receiver for receiving from the hub the signals having the plurality of analog levels, first means responsive in each of the computers to the received signals for providing a digital conversion of the received signals at a particular frequency, second means responsive in each of the computers to the digitally converted signals from the first means in such computer for regulating such digital conversion by the first means at the particular frequency, third means responsive in each of the computers to the digitally converted signals from the first means in such computer for providing an adaptive equalization of such digitally converted signals from the first means and for selecting, after such adaptive equalization, individual ones of the analog levels closest in magnitude to the digitally converted signals, and fourth means in each of the computers for decoding the individual ones of the analog levels selected by the third means in such computer to recover the information represented by the received signals.

2. In a combination as set forth in claim 1, fifth means responsive in each of the computers to the received signals in such computer for providing an automatic gain control in such signals and for introducing the gain controlled signals from the fifth means to the first means in such computer, and sixth means responsive in each of the computers to the signals from the first means in such computer for regulating the gain in the fifth means in such computer.

3. In a combination as set forth in claim 1, the third means in each of the computers including a feed forward equalizer and a decision feedback equalizer for for correcting for distortions in the digital conversion from the second means and including means responsive to the signals from the feed forward equalizer and the decision feedback equalizer for selecting, for introduction to the fourth means, the analog levels closest in magnitude to the digital conversions.

4. In a combination as set forth in claim 1, the signals received in each computer from the hub being in the form of packets each having a plurality of timing signals at the beginning of such packet, and the second means including fifth means responsive to the timing signals in each packet for regulating the frequency of the digital conversion of the received signals by the first means at the particular value.

5. In a combination as set forth in claim 1, the signals received in each computer from the hub being in the form of packets each including a plurality of signals representing data, and the second means including fifth means responsive to the signals representing data in each packet for regulating at the particular frequency the digital conversion of the received signals by the first means.

6. In a combination as set forth in claim 1, the signals received in each computer from the hub being in the form of packets each including a plurality of timing signals at the beginning of such packet and each including a plurality of signals following such timing signals and representing data, the second means including fifth means responsive to the timing signals in each packet for providing a coarse control in regulating at the particular frequency the digital conversion of the received signals by the first means, and the second means including sixth means responsive to the signals representing data in each packet for providing a fine control in regulating at the particular frequency the digital conversion of the received signals by the first means.

7. In combination for use in a system providing signals having individual ones of a plurality of analog levels to represent information, a hub, a computer displaced from the hub, a plurality of twisted pairs of wires extending between the hub and the computer, one of the twisted pairs of wires providing only for the transmission of the signals from the computer to the hub, a second one of the twisted pairs of wires providing only for the reception at the computer of the signals from the hub, third and fourth ones of the twisted pairs of wires providing for the transmission of the signals from the computer to the hub and the reception at the computer of the signals from the hub, first means responsive at the computer to the signals received at the computer through the second, third and fourth ones of the twisted pairs for providing a digital conversion of such signals at a particular frequency, timing recovery means responsive to the digitally converted signals from the first means for regulating the frequency of the digital conversion by the first means at the particular frequency, and digital adaptive equalizer means responsive to the signals from the first means for selecting individual ones of the analog levels closest in the plurality to the magnitudes of the digitally converted signals.

8. In a combination as set forth in claim 7, second means responsive at the computer to the received signals for providing an automatic gain control of such signals and for introducing such gain controlled signals to the first means, and third means responsive to the digitally converted signals from the first means for regulating the gain of the signals from the second means at a particular value, the digital adaptive equalizer means being responsive to the digitally converted signals from the first means for selecting the individual one of the analog levels closest in the plurality to the signals from the second means.

9. In a combination as set forth in claim 7, second means responsive to the selection by the digital adaptive equalizer means of the individual ones of the analog levels in the plurality for recovering the information represented by such analog levels.

10. In a combination as set forth in claim 7, the received signals being in the form of packets each including a plurality of timing signals in a preamble at the beginning of such packet and including a plurality of data signals after the preamble, and the timing recovery means including second means responsive to the timing signals in the preamble in each packet for regulating at the particular value the frequency at which the first means provides a digital conversion of the signals received at the computer.

11. In a combination as set forth in claim 7, the received signals being in the form of packets each including a plurality of timing signals at the beginning of such packet and including a plurality of data signals after the preamble, the timing recovery means including third means responsive to the timing signals in the preamble in each packet for regulating, at the particular frequency, the frequency at which the first means provides the digital conversion of the digital signals received at the computer, and fourth means responsive to the selection by the digital adaptive equalizer means of the individual ones of the analog levels for recovering the data represented by such analog levels.

12. In a combination as set forth in claim 8, the received signals being in the form of packets each including a plurality of timing signals at the beginning of such packet and including a plurality of data signals after the preamble, the timing recovery means including third means responsive to the timing signals in the preamble in each packet for regulating at the particular frequency, the frequency at which the first means provides a digital conversion of the signals received at the computer, and fourth means responsive to the selection by the digital adaptive equalizer means of the individual ones of the analog levels for recovering the data represented by such analog levels.

13. In a combination as set forth in claim 12, the timing recovery means including fifth means for regulating, at the particular frequency in accordance with the pattern of the digital conversion of the progressive ones of the timing signals in each packet, the frequency at which the first means provides a digital conversion of the timing signals received at the computer, the timing recovery means including sixth means for regulating, at the particular frequency in accordance with the pattern of the digital conversion of the progressive ones of the data signals in each packet, the frequency at which the first means provides a digital conversion of the data signals received at the computer.

14. In combination for use in a system providing signals having individual ones of a plurality of analog levels to represent information, a hub, a computer displaced from the hub, a plurality of twisted pairs of wires between the hub and the computer, individual ones of the twisted pairs of wires either transmitting or receiving the digital signals and other ones of the twisted pairs of wires selectively transmitting and receiving the digital signals, first means responsive to the signals received in the twisted pairs of wires for providing a digital conversion of the received signals at a particular rate, second means responsive to the digitally converted signals from the first means for regulating the rate of the digital conversion of the received signals at the particular rate, and third means responsive to the digitally converted signals from the first means for converting the magnitudes of such digitally converted signals to the individual ones of the analog levels closest to such magnitudes and for recovering the information represented by such analog levels.

15. In a combination as set forth in claim 14, fourth means responsive to the digitally converted signals from the first means for providing an automatic gain control of such signals and for introducing such gain controlled signals from the fourth means to the first means.

16. In a combination as set forth in claim 14, the received signals being provided in packets, and the second means including fourth means responsive to the signals in each packet for regulating the rate of the digital conversion of the received digital signals in such packet at the particular value, and the third means being responsive to the digitally converted signals in each packet from the first means for recovering the information represented by such digitally converted signals.

17. In a combination as set forth in claim 14, the received signals being provided in packets each including a plurality of timing signals at the beginning of such packet, and the second means including fourth means responsive to the timing signals in each packet for regulating the rate of the digital conversion of the received signals at the particular rate.

18. In a combination as set forth in claim 15, the received signals being provided in packets each including the progressive data signals in the preamble in such packet in individual patterns representative of the data in such packet, and the second means including fourth means responsive to the individual patterns of the progressive data signals in each packet for regulating the rate of the digital conversion of the received data signals in such packet at the particular value.

19. In a combination as set forth in claim 15, the received signals being provided in packets each including a plurality of timing signals in a preamble at the beginning of such packet and each including data signals in such packet after the timing signals in such packet, for regulating the rate of the digital conversion of the received data signals at the particular rate, the second means including sixth means responsive to the timing signals in the preamble in each packet for regulating the rate of the digital conversion of the data signals in such packet at the particular rate, and the second means including seventh means responsive to the individual patterns of the data signals in each packet for regulating the rate of the digital conversion of the received data signals in such packet at the particular rate.

20. In a combination as set forth in claim 14, the third means including digital adaptive equalizer means responsive to the digitally converted signals from the first means for selecting for each of such digitally converted signals the individual one of the analog levels closest to the magnitude of such digitally converted signal and including fourth means responsive to the selected amplitude levels from the digital adaptive equalizer means for recovering the information represented by such amplitude levels.

21. In a combination as set forth in claim 20, the received signals being provided in packets each having the data signals in such packet in individual patterns representative of the information in such packet, the second means including fifth means responsive to the individual patterns of the individual ones of the analog levels selected by the digital adaptive equalizer means in each packet for regulating the rate of the digital conversion of the received signals in such packet at the particular value.

22. In combination for use in a system providing signals having individual ones of a plurality of analog levels representing information, a hub, a computer displaced from the hub, a plurality of twisted pairs of wires between the hub and the computer, individual ones of the twisted pairs of wires either transmitting or receiving the signals and other ones of the twisted pair of wires selectively transmitting and receiving the signals, the signals being provided in packets each including a preamble providing a plurality of timing signals and, after the preamble, a plurality of data signals representing the information, first means responsive to the signals received in the twisted pairs of wires in the plurality for providing a digital conversion of the received signals at a particular rate, second means responsive to the timing signals in the preamble in each packet and providing a first gain for regulating at the particular rate the digital conversion by the first means of the received signals, third means responsive to the data signals representing the information in each packet and providing a second gain lower than the first gain for regulating at the particular rate the digital conversion by the first means of the received signals, and fourth means responsive to the digital conversions from the first means of the data signals for converting such digital conversions to the information represented by such digital conversions.

23. In a combination as set forth in claim 22, the fourth means being responsive to the digital conversions from the first means for selecting, for each of the data signals representing information in the packets, the individual ones of the analog levels closest in the plurality to the magnitude of such digital conversions.

24. In a combination as recited in claim 22, the third means including fifth means responsive to first individual patterns of the data signals representing the information in each packet for providing a first particular value for the second gain in the regulation at the particular rate of the digital conversion of the received signals by the third means, and the third means including sixth means responsive to second individual patterns of the data signals representing the information in each packet for providing a second particular value of the second gain, different from the first particular value of the second gain, in the regulation at the particular rate of the digital conversion of the received signals by the third means.

25. In a combination as recited in claim 24, the fourth means including digital adaptive equalizer means responsive to the magnitudes of the digital conversions from the first means for selecting individual ones of the analog levels closest in the plurality to such magnitudes, the fourth means also including fifth means responsive to the individual ones of the analog levels selected by the digital adaptive equalizer means for decoding such selected analog levels to recover the information represented by such analog levels.

26. In a combination as recited in claim 22, fifth means responsive to the received signals for providing an automatic gain control of such signals, and sixth means responsive to the digital conversions from the first means for regulating the automatic gain of the signals from the fifth means at a particular value.

27. In a combination as set forth in claim 25, sixth means responsive to the received signals for providing an automatic gain control of such signals, and seventh means responsive to the digital conversions from the first means for regulating the gain of the signals from the fifth means at a particular value.

28. In combination for use in a system providing signals having individual ones of a plurality of analog levels representing information and providing a computer and a hub displaced from the computer and a plurality of twisted pairs of wires between the hub and the computer, individual ones of the twisted pairs of wires either transmitting or receiving the signals and other ones of the twisted pair of wires selectively transmitting and receiving the signals, the signals being provided in packets each having a preamble providing a plurality of timing signals and, after the preamble, a plurality of data signals representing the information, first means disposed in the computer and responsive to the signals received in the twisted pairs of wires for providing a digital conversion of the received signals at a particular rate, second means disposed in the computer and responsive to the preamble in each packet for regulating with a first gain factor the digital conversion of the received signals at the particular rate, third means disposed in the computer and responsive to the digital conversions of the data signals representing the information in each packet for regulating with a second gain factor lower than the first gain factor the digital conversion of such data signals at the particular rate, and fourth means disposed in the computer and responsive to the digital conversions of the data signals from the first means for converting such digital conversions to the information represented by such digital conversions.

29. In a combination as set forth in claim 28, the fourth means being responsive to the digital conversions of the data signals from the first means for selecting, for each of such digital conversions, the individual one of the analog levels closest in magnitude to such digital conversions.

30. In a combination as recited in claim 28, the third means including fifth means responsive to first individual patterns of the digital conversions of the data signals in each packet for providing a regulation, with a first particular value of the first gain factor at the particular rate, of such digital conversions, and the third means including sixth means responsive to second individual patterns of the digital conversions of the data signals in each packet for providing a regulation with a second particular value of the gain factor different from the first particular value of the second gain factor, of such digital conversions.

31. In a combination as recited in claim 30, the fourth means including digital adaptive equalizer means responsive to the digital conversions of the data signals from the first means for selecting individual ones of the analog levels closest in magnitude in the plurality to the digital conversions, the fourth means also including fifth means responsive to the digital conversions of the data signals from the digital adaptive equalizer means for decoding the analog levels selected by the digital adaptive equalizer means to recover the information represented by such analog levels.

32. In a combination as recited in claim 28, fifth means responsive to the received signals for providing an automatic gain control of such signals, and sixth means responsive to the digital conversions from the first means for regulating the gain of the signals from the fifth means at a particular value.

33. In a combination as set forth in claim 31, fifth means responsive to the received signals for providing an automatic gain control of such signals, and sixth means responsive to the digital conversions from the first means for regulating the gain of the signals from the fifth means at a particular value.

34. In combination for use in a system providing signals having individual ones of a plurality of analog levels to represent information and including a hub and a computer displaced from the hub and including a plurality of twisted pairs of wires extending between the hub and the computer, one of the twisted pairs of wires providing only for the transmission of the signals from the computer to the hub, a second one of the twisted pairs of wires providing only for the reception at the computer of the signals from the hub, third and fourth ones of the twisted pairs of wires selectively providing for the transmission of the signals from the computer to the hub and the reception at the computer of the signals from the hub, first means responsive at the computer to the signals received at the second, third and fourth ones of the twisted pairs for providing a digital conversion of such signals at a particular value of frequency, timing recovery means responsive at the computer to the digital conversions from the first means for regulating at the particular value the frequency of the digital conversions by the first means, and digital adaptive equalizer means responsive at the computer to the signals from the first means for selecting individual ones of the analog levels closest in magnitude to the digital conversions from the first means.

35. In a combination as set forth in claim 34, second means responsive at the computer to the received signals for providing an automatic gain control of such signals and for introducing such signals to the first means, and third means responsive at the computer to the digital conversions from the first means for regulating the gain of the signals from the second means at a particular value, the digital adaptive equalizer means being responsive to the digital conversions from the first means for selecting the individual ones of the analog levels closest in magnitude to the digital conversions from the first means.

36. In a combination as set forth in claim 34, second means responsive at the computer to the signals from the digital adaptive equalizer means for recovering the information represented by the analog levels selected by the digital adaptive equalizer means.

37. In a combination as set forth in claim 34, the received signals being in the form of packets each including a plurality of timing signals in a preamble at the beginning of such packet and including data signals after the preamble, and the timing recovery means including second means responsive to the timing signals in each packet for regulating at the particular value the frequency at which the first means provides a digital conversion of the signals received at the computer.

38. In a combination as set forth in claim 34, the received signals being in the form of packets each including a plurality of timing signals at the beginning of such packet and including data signals after the preamble, the timing recovery means including second means responsive to the timing signals in each packet for regulating at the particular value the frequency at which the first means provides the digital conversion of the data signals received at the computer in each packet, and third means responsive to the analog levels selected by the digital adaptive equalizer means for the data signals in each packet for recovering the data represented by such selected analog levels.

39. In a combination as set forth in claim 35, the received signals being in the form of packets each including a plurality of timing signals at the beginning of such packet and including data signals after the preamble, the timing recovery means including fourth means responsive to the timing signals in each packet for regulating at the particular value the frequency at which the first means provides a digital conversion of the signals received at the computer in each packet, and fifth means responsive to the analog levels selected by the digital adaptive equalizer means in each packet for recovering the data represented by such selected analog levels.

40. In a combination as set forth in claim 38, fifth means disposed at the computer for regulating at the particular value, in accordance with the pattern of successive ones of the signals in each packet, the frequency at which the first means provides a digital conversion of the signals received at the computer.

41. In combination for use in a system including a hub and a plurality of twisted pairs of wires to provide packets of signals where each packet includes a preamble defined by a plurality of timing signals and includes a plurality of data signals following the preamble, each of the data signals having an individual one of a plurality of analog values to represent information and where the timing signals and the data signals in the packets are transmitted through the twisted pairs of wires from the hub, a computer displaced from the hub for receiving the packets including the timing signals in preamble and the data signals representing the information, the computer including a plurality of channels each responsive to the packets received by the computer from an individual one of the pairs of the twisted wires, each individual one of the channels including first means for providing digital conversions at the particular rate of the signals received in each packet in such channel, each individual one of the channels including second means responsive to the digital conversions from the first means in each of the channels for operating upon such signals to regulate the digital conversions of the received signals by the first means at the particular rate, and each individual one of the channels including third means responsive to the digital conversions of the data signals from the first means in such channel for selecting the individual ones of the analog values in the plurality closest in magnitude to the digital conversions of the data signals received in such channel.

42. In a combination as set forth in claim 41, including, fourth means responsive to the analog values selected by the third means in each of the channels for decoding such analog values and for combining such decoded analog values for the different channels to recover the information.

43. In a combination as set forth in claim 41 wherein the second means in each individual one of the channels includes fourth means responsive to the timing signals in the packets in such channel for operating upon such timing signals to regulate the digital conversions of the received signals by the first means at the particular rate and wherein the second means in each individual one of the channels includes sixth means responsive to the data signals representing the information in the packets in such channel for operating upon such data signals to regulate the digital conversion of the received signals by the first means at the particular rate.

44. In a combination as set forth in claim 42 wherein the second means in each of the channels includes fifth means responsive to the timing signals in the packets in such channel for operating upon such timing signals to regulate with a first particular gain factor the digital conversion of the received signals by the first means at the particular rate and wherein the third means in each of the channels includes sixth means responsive to the digital conversions of the data signals representing the information in the packets in such channel for operating upon such digital conversions to regulate with a second particular gain factor the digital conversion of the data signals by the first means at the particular rate and wherein the second particular gain factor is less than the first particular gain factor.

45. In combination for use in a system including a hub and a plurality of twisted pairs of wires to provide packets of signals where each packet includes a preamble defined by a plurality of timing signals and includes a plurality of data signals having individual ones of a plurality of analog levels to represent information and where the signals in the packets are transmitted through a plurality of the twisted pairs of wires from the hub, a computer displaced from the hub for receiving the packets including the timing signals in the preamble and the data signals transmitted from the hub, the computer including a plurality of channels each individual one of which receives the signals in the packets in at least an individual one of the twisted pairs, each individual one of the channels including first means for providing an automatic gain control of the signals in the packets in such channel, each individual one of the channels including second means for providing a digital conversion at a particular rate of the signals in the packets from the first means in such channel, each individual one of the channels including third means responsive to the signals from the second means in such channel for regulating the gain of the signals from the first means in such channel at a particular value, each individual one of the channels including fourth means responsive to the digital conversions from the second means in such channel for selecting the individual ones of the analog levels in the plurality closest in magnitude to the digital conversions of the data signals in each packet from the second means, each individual one of the channels including fifth means responsive to the digital conversions from the second means for regulating at the particular rate the digital conversion of the signals in the packets in such channel by the second means.

46. In a combination as set forth in claim 45, the fifth means in each individual one of the channels including sixth means responsive to the timing signals in the preamble in the packets in such channel for providing a first regulation in the digital conversions by the second means of the signals in such packets at the particular rate, and the fifth means in each individual one of the channels including seventh means responsive to the data signals representing the information in the packets in such channel for providing a second regulation in the digital conversions by the second means of the data signals in such packets at the particular rate, the first regulation being different from the second regulation.

47. In a combination as set forth in claim 45, the fifth means in each individual one of the channels including sixth means responsive to the timing signals in the preamble in the packets in such channel for providing a first regulation with a first gain factor in the conversion by the second means of the signals in such packets at the particular rate, and the fifth means in each individual one of the channels including seventh means responsive to the data signals representing the information in the packets in such channel for providing a second regulation with a second gain factor in the digital conversion by the second means of the data signals in such packets at the particular rate, the second gain factor being less than the first gain factor, and eighth means for recovering the information represented by the individual ones of the analog levels selected by the fourth means.

48. In a combination as set forth in claim 47, the seventh means for each individual one of the channels including eighth means responsive to a first pattern of the digital conversions of the data signals representing the information in the packets in such channel for providing a third regulation with a third gain factor in the digital conversions by the second means of the data signals in such packets at the particular rate, the third gain factor being less than the second gain factor.

49. In a combination as set forth in claim 43, the fourth means for each individual one of the channels including a feed forward equalizer, a decision feedback equalizer, a multi-level data slicer and an adder responsive to the outputs from the feed forward equalizer and the decision feedback equalizer for providing an output to the multi-level data slicer, the feed forward equalizer receiving the output from the second means for such channel and the decision feedback equalizer receiving the output of the data slicer, and means for decoding the outputs from the data slicers in the different channels and for combining such outputs to recover the information.

50. In a combination as set forth in claim 45, sixth means for decoding the analog levels selected by the fourth means for the digital conversions of the data signals in the different channels and for combining such decoded analog levels to recover the information represented by the such digital conversions.

51. In a combination as set forth in claim 49, there being a plurality of data slicers each included in the fourth means in an individual one of the channels for selecting the individual ones of the analog levels closest in magnitude to the digital conversions of the data signals in such channel, sixth means for decoding the analog levels selected by the second means for the digital conversions of the data signals in the different channels and for combining such decoded analog levels to recover the information represented by the digital conversions of the data signals in the different channels, and means for recovering the information represented by the analog levels selected by the data slicer in each channel from the digital conversions of the data signals in such channels.

52. In combination for use in a system providing signals having individual ones of a plurality of analog levels to represent information, a hub, a computer, a plurality of pairs of twisted wires connecting the hub and the computer, a first one of the twisted pairs of wires being only for transmission of the signals from the computer to the hub, a second one of the twisted pairs of wires being only for the reception of the digital signals at the computer from the hub and third and fourth ones of the twisted pairs of wires being for the selective transmission of the signals from the computer to the hub and for the selective reception of the signals at the computer from the hub, first means at the computer for transmitting the signals through the individual ones of the first, third and fourth pairs of the twisted wires from the computer to the hub, second means at the computer for receiving the signals passing through the individual ones of the second, third and fourth pairs of the twisted wires from the hub, a media access controller for establishing a priority between the signals received by the computer and the signals transmitted by the computer when the received and transmitted signals occur simultaneously, a plurality of third means each responsive in the computer to the digital signals received through an individual one of the second, third and fourth twisted pairs of wires for providing a digital conversion of such signals at a particular rate, a plurality of fourth means each responsive in the computer to the digital conversions of the signals from an individual one of the third means in the plurality for regulating the digital conversions by such individual one of the third means at the particular rate, and a plurality of fifth means each responsive in the computer to the digital conversions from an individual one of the third means in the plurality for establishing for each of such digital conversions an individual one of the plurality of analog levels closest in magnitude to such digital conversions from the first means.

53. In a combination as set forth in claim 52, sixth means responsive to the analog levels established by the fifth means in the plurality for decoding such analog levels and for combining the decoded analog levels to recover the information represented by such analog levels.

54. In a combination as set forth in claim 52, a plurality of sixth means each responsive in the computer to the signals received through an individual one of the second, third and fourth twisted pairs of lines for providing an automatic gain control of such signals, and a plurality of seventh means each responsive in the computer to the digital conversions from an individual one of the third means in the plurality for regulating the gain of the signals from an individual one of the fourth means in the plurality at a particular value.

55. In a combination as set forth in claim 52, the signals received by the computer through the second, third and fourth of the twisted pairs of wires being provided in packets each having a preamble defined by a plurality of timing signals and each providing, after the preamble, data signals representing information, each of the fourth means in the plurality including sixth means responsive to the digital conversions of the timing signals in the preamble in the packets from an individual one of the third means in the plurality for regulating in a first relationship such digital conversions at the particular rate, each of the fourth means in the plurality including seventh means responsive to the digital conversions of the data signals following the preamble in the packets from an individual one of the third means in the plurality for regulating in a second relationship such digital conversions at the particular rate, the second relationship being different from the first relationship.

56. In a combination as set forth in claim 55, the regulation in the first relationship being operative with a first gain factor, the regulation in the second relationship being operative with a second gain factor, the second gain factor being less than the first gain factor, and eighth means responsive to the analog levels established by the fifth means in the plurality for decoding such analog levels and for combining the decoded analog levels to recover the information represented by such decoded analog levels.

57. In a combination as set forth in claim 56, a plurality of ninth means each responsive to the signals received through an individual one of the second, third and fourth twisted pairs of wires for providing an automatic gain control of such signals, and a plurality of tenth means each responsive to the digital conversions from an individual one of the third means in the plurality for regulating at a particular value the gain of the signals from an individual one of the ninth means in the plurality.

58. In combination for use in a computer included in a system having a hub for providing packets of signals where each packet includes a preamble defined by a plurality of timing signals and includes a plurality of data signals having individual ones of a plurality of analog levels to represent information, first means for receiving the packets of the signals from the hub, second means responsive to the signals in the packets received from the hub for providing a digital conversion of such signals at a particular rate, third means responsive to the digital conversions from the second means and the timing signals in the preamble in each packet for producing a first output dependent upon the occurrence of such timing signals relative to the digital conversions from the second means, fourth means responsive to the digital conversions from the second means and the data signals following the preamble in each packet for producing a second output dependent upon the occurrence of the data signals in the packets relative to such digital conversions, fifth means for providing clock signals at a rate constituting an integral multiple of the particular rate, and sixth means selectively responsive to the first output from the third means and the second output from the fourth means for passing individual ones of the clock signals from the fifth means to the second means in accordance with the selected ones of the first and second outputs to obtain a regulation of the digital conversions by the second means at the particular rate.

59. In a combination as set forth in claim 58, the second means being operative to provide the digital conversion of the signals in the packets received from the hub in accordance with the individual ones of the clock signals passed by the sixth means, the third means being operative at a first gain factor to produce the first output, and the fourth means being operative at a second gain different from the first gain to produce the second output.

60. In a combination as set forth in claim 58, the second means being operative to provide the digital conversion of the signals in the packets received from the hub in accordance with the individual ones of the clock signals passed by the sixth means, and seventh means responsive to the digital conversions by the second means of the data signals in the packets received from the hub for operating upon such data signals to recover the information represented by such digital conversions.

61. In a combination as set forth in claim 59, seventh means responsive to the digital conversions of the data signals from the second means for selecting the individual ones of the analog levels closest in magnitude to the peaks of such digital conversions, and eighth means for recovering the information from the individual ones of the analog levels selected by the seventh means.

62. In a combination as set forth in claim 58, the fifth means including a plurality of amplifiers connected in a ring oscillator, each of the amplifiers being connected in the ring oscillator to pass a signal on a cyclic basis relative to the signals passed by the other amplifiers in the ring oscillator, seventh means for selectively passing the first output from the third means during the occurrence of the timing signals in the preamble in each packet and for selectively passing the second output from the fourth means during the occurrence of the data signals following the preamble in each packet, and eighth means for passing the signal from an individual one of the amplifiers in the fifth means for each packet in response to the output from the seventh means for such packet.

63. In a combination as set forth in claim 58, seventh means for transmitting the signals from the computer to the hub, and eighth means in the computer for providing a priority between the signals transmitted by the computer and the signals received by the computer when the transmitted and received signals occur simultaneously at the computer.

64. In combination for use in a system having a hub for providing packets of signals where each packet includes a preamble defined by a plurality of timing signals and includes a plurality of data signals having individual ones of a plurality of analog levels to represent information, first means for receiving the signals in each packet, second means responsive to the signals received in each packet for providing digital conversions of such signals at a particular rate, third means responsive to the digital convertsions from the second means for producing individual ones of the analog levels in the plurality, the individual one of the analog levels for each of the digital convertsions being that analog level closest to the peak amplitude of such digital convertsion, fourth means responsive to the digital conversions from the second means in each packet for regulating the digital conversions of the received signals in each packet at the particular rate, and fifth means responsive to the individual ones of the analog levels from the third means for converting such analog levels to the information represented by the data signals in the packets.

65. In a combination as set forth in claim 64, the second means including sixth means responsive to the digital conversions in each preamble in each packet for regulating the digital conversions at the particular rate, and the second means including seventh means responsive to the digital conversions of the data signals following each preamble in each packet for regulating such digital conversions at the particular rate.

66. In a combination as set forth in claim 64, each of the digital conversions from the second means having a peak amplitude and a zero crossing, the fourth means including sixth means responsive to first patterns in the peak amplitudes and zero crossings of the digital conversions produced by the second means for regulating with a first gain factor such digital conversions at the particular rate, and the fourth means including seventh means responsive to second patterns in the peak amplitudes and the zero crossings of the digital conversions produced by the second means for regulating with a second gain factor such digital conversion at the particular rate, the second gain factor being different than the first gain factor.

67. In a combination as set forth in claim 64, the third means including a first equalizer, a data slicer, an adder and a second equalizer, the first equalizer being responsive to the digital conversions from the second means and the data slicer providing digital signals and the second equalizer being responsive to the digital signals from the data slicer and the adder being responsive to the signals from the first and second equalizers and the data slicer being responsive to the digital signals from the adder for producing from the data slicer the individual ones of the analog levels in the plurality, and the fifth means being responsive to the individual ones of the plurality of amplitude levels from the third means for converting such individual ones of the analog levels to the information represented by the digital signals in the packets.

68. In combination for use in a system having a hub for providing packets of signals where each packet includes a preamble defined by a plurality of timing signals and includes a plurality of data signals following the preamble and having individual ones of a plurality of analog levels to represent information, first means for receiving the signals in each packet, second means for providing digital conversions of the received signals in each packet at a particular rate, third means responsive to the digital conversions from the second means during the occurrence of the timing signals in the preamble in each packet for determining the amplitudes and polarities of such digital conversions at the times assumed by the third means to constitute the peaks and zero crossings of such digital conversions, fourth means responsive to first patterns in the amplitudes determined by the third means at the times assumed by the third means to constitute the peaks and zero crossings of such digital conversions for providing a first phase adjustment in the digital conversions from the second means, fifth means responsive to second patterns in the amplitudes determined by the third means at the times assumed by the third means to constitute the peaks and zero crossings of such digital conversions for providing a second phase adjustment in the digital conversions from the second means, and sixth means responsive to the digital conversions from the second means for recovering the information represented by the signals in the packets, the first phase adjustment being different from the second phase adjustment.

69. In a combination as set forth in claim 68 wherein the third means provides first and second determinations in each cycle of the amplitudes of the digital conversions from the second means at times assumed by the third means to correspond to the peaks and zero crossings in such cycle, and the fourth means provides the first phase adjustments when the amplitude determined by the third means at the times assumed by the third means to be the peaks of such digital conversions is greater than the amplitudes, amplified by a particular constant, determined by the third means at the times assumed in the third means to be the zero crossings of such digital conversions.

70. In a combination as set forth in claim 68 wherein the third means respectively provides first and second determinations in each cycle of the digital conversions from the second means during the preamble in each packet at times assumed by the third means to correspond to the peak and zero crossings of the digital conversions in such cycle and the fourth means provides the first phase adjustments during the preamble in each packet when the amplitudes determined by the third means at the times assumed by the third means to be the peaks of such digital conversions is greater than the amplitudes, amplified by a particular gain, determined by the third means at the times assumed by the third means to be the zero crossings of such digital conversions and the fifth means provides the second phase adjustments during the preamble in each packet when the amplitudes determined by the third means at the times assumed by the third means to be the peaks of the digital conversions is less than the amplitudes, amplified by the particular gain factor, determined by the third means at the times assumed by the third means to be the zero crossings of such digital conversions.

71. In a combination as set forth in claim 70 wherein the fourth means provides the first phase adjustments in each cycle during the preamble in each packet until the product of the amplitudes of the first and second determinations in such cycle is zero, and the fifth means provides the second phase adjustments in each cycle during the preamble in each packet until the product of the amplitudes of the first and second determinations of the amplitudes in such cycle is zero.

72. In combination for use in a system having a hub for providing packets of signals where each packet includes a preamble defined by a plurality of timing signals and includes a plurality of data signals following the preamble and having individual ones of a plurality of analog levels to represent information, first means for receiving the signals in each packet, second means for providing a digital conversion of the received signals in each packet at a particular rate, third means for providing digital outputs at progressive times during each digital conversion from the second means, fourth means for operating upon the digital conversions from the second means during the occurrence of the timing signals in the preamble in each packet at times assumed by the fourth means to constitute the peaks and zero crossings of such digital conversions to determine the amplitudes and polarities of the digital conversions at such times, fifth means responsive in each cycle of the timing signals in the preamble in each packet to the amplitudes and polarities determined for the digital conversions in such cycle to select a particular one of the digital outputs at the progressive times from the third means for providing the digital conversions by the second means, sixth means responsive to the digital conversions by the second means of the data signals following the preamble in each packet for selecting the analog levels of such data signals closest in magnitudes to the peaks of the digital conversions, and seventh means responsive to the analog levels selected by the sixth means for recovering the information represented by such analog levels.

73. In a combination as set forth in claim 72, the fifth means including eighth means responsive to the magnitudes of the digital conversions determined by the fourth means at the times assumed by the fourth means to be the peak of the digital conversions during the preamble in each packet and at the times assumed by the fourth means to be the zero crossings of such digital conversions during the preamble in such packet for providing a particular adjustment in the selection of the particular one of the digital outputs at the progressive times from the third means in obtaining the digital conversions by the second means.

74. In a combination as set forth in claim 72, the fifth means including eighth means responsive to the magnitudes of the digital conversions determined by the fourth means at the times assumed by the fourth means to be the peak of the digital conversions after the preamble in each packet and the magnitudes of the digital conversions determined by the fourth means at the times assumed by the fourth means to be the zero crossing of such digital conversions after the preamble in such packet for providing a particular adjustment in the selection of the particular one of the digital outputs at the progressive times from the third means in obtaining the digital conversions by the second means.

75. In a combination as set forth in claim 72, the sixth means including eighth means responsive to the signals from the second means in representation of the information in the packets for selecting individuals one of a plurality of pre-selected amplitude levels, the individual one of the pre-selected amplitude levels being that closest for each of the digital signals to the amplitude of such digital signal from the second means, and automatic gain control means for regulating the gain of the seventh means including ninth means responsive to the individual ones of the automatic gain control means for regulating the gain of the digital conversions from the second means at a particular value.

76. In combination for use in a system having a hub for providing packets of signals where each packet includes a preamble defined by a plurality of timing signals and includes a plurality of data signals following the preamble and having individual ones of a plurality of analog levels to represent information, first means for receiving the signals in each packet, second means for providing a digital conversion of the received signals in each packet at a particular rate, third means for operating upon the digital conversions from the second means during the occurrence of the timing signals in the preamble in each packet at times assumed by the third means to constitute the peaks and zero crossings of such digital conversions to determine the amplitudes and polarities of such digital conversions at such assumed times, fourth means responsive in each cycle of the timing signals in the preamble in each packet to a first relationship in the amplitudes and polarities of the digital conversions at such assumed times in such cycle for providing a first adjustment in subsequent cycles of the timing signals in the times assumed by the third means to constitute the peaks and zero crossings of the digital conversions in the preamble in such packet, fifth means responsive to the operation of the fourth means in providing the first adjustment in the times assumed by the third means to constitute the peaks and zero crossings of the digital conversions in the preamble of such packet for preventing any further ones of such first adjustments in such assumed times in the preamble in such packet, sixth means responsive in each cycle of the timing signals in the preamble in each packet to a second relationship in the amplitudes and polarities of the digital conversions at such assumed times in such cycle for providing a second adjustment, less than the first adjustment, in subsequent cycles of the timing signals in the times assumed by the third means to constitute the peaks and zero crossings in the preamble in such packet, and seventh means responsive to the adjustments in the times assumed by the third means to constitute the peaks and zero crossings of the digital conversions in the preamble in each packet for providing corresponding adjustments in the time for the digital conversion of the data signals in such packet to regulate the digital conversions of the data signals at the particular rate.

77. In a combination as set forth in claim 76, eighth means responsive to the digital conversions at the particular rate of the data signals following the timing signals in each packet for recovering the information represented by such data signals.

78. In a combination as set forth in claim 76, eighth means for preventing adjustments in the times assumed by the third means to constitute the peaks and zero crossings of the digital conversions during the preamble in each packet after a particular number of timing signals has occurred in such preamble.

79. In a combination as set forth in claim 76, eighth means responsive to the digital conversions by the second means for determining, for each of the data signals following the preamble in each packet, the individual ones of the amplitude levels closest in the plurality to the peaks of such digital conversions, and ninth means responsive to the analog levels determined by the eighth means for recovering the information represented by such analog levels.

80. In a combination as set forth in claim 77, ninth means for operating upon the digital conversions from the second means, after the preamble in each packet, at times assumed by the ninth means to constitute the peaks and zero crossings of such digital conversions, to determine the amplitudes and polarities of such digital conversions at such assumed time, and tenth means for operating upon the digital conversions from the second means, after the preamble in each packet, to provide adjustments in the times assumed by the ninth means to constitute the peaks and zero crossings of the digital conversions, in accordance with the relative amplitudes and polarities of the digital conversions at the times assumed by the ninth means to constitute the peaks and zero crossings of such digital conversions, the tenth means being operative to provide adjustments in the times assumed by the ninth means to constitute the peaks and zero crossings of the digital conversions in subsequent cycles of the data signals in the packets.

81. In combination for use in a system having a hub for providing packets of signals where each packet includes a preamble defined by a plurality of timing signals and includes a plurality of data signals following the preamble and having individual ones of a plurality of analog levels to represent information, first means for receiving the signals in each packet, second means for providing a digital conversion at a particular rate of the received signals in each packet, third means for determining, for each of the digital conversions following the preamble in each packet, the individual one of the analog levels closest in magnitude to the peak of such digital conversions, fourth means for operating upon the digital conversions from the second means, during the occurrence of the data signals following the preamble in each packet, at times assumed by the fourth means to constitute the peaks and zero crossings in such digital conversions to respectively determine the amplitude levels from the second means at such assumed times, fifth means responsive to the amplitude levels determined by the fourth means for each digital conversion of the data signals for providing adjustments in the rate of the digital conversions by the second means to regulate such digital conversions at the particular rate, and sixth means for preventing the operation of the fourth means during the occurrence of the timing signals in each packet and during the time between the occurrence of successive packets.

82. In a combination as set forth in claim 81, seventh means responsive to the individual ones of the analog levels determined by the fourth means for decoding such analog levels to recover the information represented by such analog levels.

83. In a combination as set forth in claim 81, the fifth means including seventh means responsive in a first relationship to a first pattern of the amplitude levels determined by the fifth means at the times assumed by the fourth means to be the peaks and zero crossings of the digital conversions from the second means for providing first adjustments in the rate of such digital conversions, and the fifth means including eighth means responsive in a second relationship to a second pattern of the amplitude levels determined by the fifth means at the times assumed by the fifth means to be the peaks and zero crossings of the digital conversions for providing second adjustments in the rate of such digital conversions, the second adjustments being different from the first adjustments.

84. In a combination as set forth in claim 83, the amplitude levels of the digital conversions in the first pattern providing a transition between amplitude levels of one polarity and amplitude levels of the opposite polarity, the amplitude levels of the digital conversions in the second pattern constituting amplitude levels of the same polarity, the seventh means being operative with a higher gain factor than the eighth means.

85. In combination for use in a system having a hub for providing packets of signals where each packet includes a preamble defined by a plurality of timing signals and includes a plurality of data signals having individual ones of a plurality of analog levels to represent information, first means for receiving the signals in each packet, second means responsive to the signals received in each packet for providing a digital conversion of such signals at a particular rate, third means for determining the phase and amplitude of the digital conversions from the second means at the times assumed by the third means to be the peaks and zero crossings of such digital conversions, fourth means responsive to the phases and amplitudes determined by the third means during the timing signals in the preamble in each packet for providing first adjustments in the rate of such digital conversions to regulate the digital conversions at the particular rate, fifth means responsive to each digital conversion following the preamble in each packet for selecting the analog level closest in the plurality to the peak assumed by the third means in such digital conversion, and sixth means responsive to the phases and amplitudes determined by the third means in the digital conversion during the data signals in each packet for providing second adjustments in the rate of such digital conversions to regulate at the particular rate the digital conversions of the data signals.

86. In a combination as set forth in claim 85, the fourth means providing the first adjustments at a higher gain factor than the gain factor of the second adjustments provided by the sixth means.

87. In a combination as set forth in claim 86, seventh means for activating the fifth and sixth means only during the occurrence of the data signals following the preamble in each packet.

88. In a combination as set forth in claim 85, seventh means responsive to the analog levels selected by the fifth means for converting such analog levels to the information represented by the data signals following the preamble in each packet.

89. In a combination as set forth in claim 85, the fourth means including seventh means responsive to a first relationship in the phases and amplitudes of the peaks and zero crossings determined by the fourth means in the preamble in each packet for providing a phase inversion in the times for such determinations of the peaks and zero crossings during such preamble in such packet, the fourth means including eighth means responsive to a second relationship in the phases and amplitudes of the peaks and zero crossings determined by the fourth means in the preamble in each packet for providing adjustments, less in phase than the phase inversion, in the times for the determinations of such peaks and zero crossings during such preamble in such packet.

90. In a combination as set forth in claim 89, ninth means for limiting the operation of the seventh means to provide only one phase inversion in the times for the determination of the peaks and zero crossings in the preamble in each packet.

91. In a combination as set forth in claim 85, seventh means for providing for the operation of the fourth means only during the occurrence of a first particular number of timing signals in the preamble in each packet.

92. In a combination as set forth in claim 89, the fourth means providing the first adjustments at a higher gain factor than the gain factor of the second adjustments provided by the sixth means, ninth means for activating the fifth and sixth means only during the occurrence of the data signals following the preamble in each packet, tenth means for limiting the operation of the seventh means to only one phase inversion in the times for the determination of the peaks and zero crossings in the preamble in each packet, eleventh means for activating the fourth means only during the first occurrence of a particular number of timing signals in the preamble in each packet, and twelfth means responsive to the analog levels selected by the fifth means for converting such analog levels to the information represented by the data signals following the preamble in each packet.

93. In combination for use in a system having a hub for providing packets of signals where each packet includes a preamble defined by a plurality of timing signals and includes a plurality of data signals having individual ones of a plurality of analog levels to represent information, first means for receiving the signals in each packet, second means responsive to the signals received in each packet for providing a digital conversion of such signals at a particular rate, third means for determining the phases and amplitudes of the digital conversions from the second means at times assumed by the third means to be the peaks and zero crossings of such digital conversions, fourth means responsive to the amplitudes and phases of the peaks and zero crossings determined by the third means in the preamble in each packet for adjusting the rate of such digital conversions in accordance with such amplitudes and phases to regulate the digital conversions at the particular rate, fifth means for boosting the gain of the digital conversions from the second means when the amplitudes of the peaks and zero crossings from the second means are below a particular value, and sixth means responsive to the digital conversions from the second means for recovering the information represented by the digital conversions following the preamble in each packet.

94. In a combination as set forth in claim 93, the fifth means boosting the gain of the digital conversions by a first particular value when the amplitudes of the peaks and zero crossings from the second means are below a first particular value, and seventh means for boosting the gain of the digital conversions by a second particular value greater than the first particular value when the amplitudes of the peaks and zero crossings determined by the second means are below a second particular value less than the first particular value.

95. In a combination as set forth in claim 93, seventh means for providing a phase inversion in the times of the determinations of the peaks and zero crossings by the second means in the timing signals when the amplitudes of such determinations in such timing signals have a particular relationship, thereby to adjust the rate of the digital conversions in a direction to regulate the digital conversions at the particular rate, and eighth means for preventing any other adjustments in the rate of the digital conversions at the time that the phase inversion is being provided by the seventh means.

96. In a combination as set forth in claim 93, seventh means responsive to the signals received in each packet for providing an automatic gain control in such signals, the second means being responsive to the signals from the seventh means for providing the digital conversion of such signals at the particular rate.

97. In a combination as set forth in claim 93, a ring oscillator formed from a plurality of amplifiers connected in a sequence in a closed loop, each of the amplifiers in the sequence being connected to provide an output signal at the particular rate with a phase adjusted by a particular magnitude from the phase of the output signal in the previous amplifier in the sequence, and seventh means operatively coupled to the amplifiers in the ring oscillator and to the fourth means for selecting an individual one of the amplifiers in accordance with the adjustments provided by the fourth means to obtain the digital conversions by the second means at the particular rate.

98. In a combination as set forth in claim 93, seventh means for providing a phase inversion in the times of the determination by the second means of the peaks and zero crossings in the digital conversions of the timing signals when the amplitudes of such determinations in such timing signals have a particular relationship, thereby to minimize the time for adjusting the rate of the digital conversions to the particular value, and eighth means for limiting the magnitudes in the adjustments of the rate of the digital conversions in the timing signals at the times after the phase inversions.

99. In combination for use in a system having a hub for providing packets of signals where each packet includes a preamble defined by a plurality of timing signals and includes a plurality of data signals having individual ones of a plurality of analog levels to represent information, first means for receiving the signals in each packet, second means responsive to the signals received in each packet for providing a digital conversion of such signals at a particular rate, third means for determining the magnitudes of the digital conversions from the second means at the times assumed by the third means to be the peaks and zero crossings of such digital conversions, fourth means responsive to the magnitudes of the peaks and zero crossings determined by the third means in each preamble in each packet for providing first adjustments in the rate of such digital conversions when the magnitudes of such determinations have a first particular relationship, thereby to regulate the digital conversions at the particular rate, fifth means for providing a phase inversion in the times of the determinations of the peaks and zero crossings by the third means of the digital conversions in the timing signals when the magnitudes of such determinations have a second particular relationship different from the first particular relationship, thereby to adjust the rate of the digital conversions in a direction to regulate the digital conversions at the particular rate, the phase inversions being greater in phase than the first adjustments, and sixth means for preventing any other adjustments in the rate of the digital conversions at the time that the phase inversion is being provided by the fifth means.

100. In a combination as set forth in claim 99, seventh means responsive to the signals received in each packet for providing an automatic gain control in such signals, the second means being responsive to the signals from the seventh means for selectively providing the digital conversion of such signals at the particular rate.

101. In a combination as set forth in claim 99, a ring oscillator formed from a plurality of amplifiers connected in a sequence in a closed loop, each of the amplifiers in the sequence being connected to provide an output signal at the particular rate with a phase adjusted by a particular magnitude from the phase of the output signal in the previous amplifier in the sequence, and seventh means operatively coupled to the amplifiers in the ring oscillator and to the fourth means for selecting an individual one of the amplifiers in accordance with the adjustments provided by the fourth means to obtain the digital conversions by the second means at the particular rate.

102. In a combination as recited in claim 99, eighth means for limiting the magnitudes in the adjustments of the rate of the digital conversions at the times after the phase inversions.

103. In a combination as set forth in claim 99, seventh means for boosting the gain of the digital conversions by the second means when the magnitudes of the determinations of the peaks and zero crossings by the third means of the digital conversions are below a particular value, and eighth means responsive to the digital conversions from the second means for recovering the information represented by the digital conversions of the data signals following the preamble in each packet.

* * * * *